(12) United States Patent
Kempter

(10) Patent No.: US 9,767,068 B2
(45) Date of Patent: Sep. 19, 2017

(54) MICROLITHOGRAPHIC PROJECTION EXPOSURE APPARATUS

(71) Applicant: Carl Zeiss SMT GmbH, Oberkochen (DE)

(72) Inventor: Christian Kempter, Wittislingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1018 days.

(21) Appl. No.: 13/747,118

(22) Filed: Jan. 22, 2013

(65) Prior Publication Data

US 2013/0132037 A1 May 23, 2013

Related U.S. Application Data

(63) Continuation of application No. PCT/EP2010/004816, filed on Aug. 6, 2010.

(51) Int. Cl.
*G06F 15/00* (2006.01)
*G03F 7/20* (2006.01)
*G01J 3/00* (2006.01)

(52) U.S. Cl.
CPC ............... *G06F 15/00* (2013.01); *G01J 3/00* (2013.01); *G03F 7/70116* (2013.01); *G03F 7/70508* (2013.01)

(58) Field of Classification Search
USPC ........................................................ 702/189
See application file for complete search history.

(56) References Cited

U.S. PATENT DOCUMENTS

| | | | |
|---|---|---|---|
| 2003/0142275 A1* | 7/2003 | Yoshida | G03B 21/005 353/31 |
| 2005/0138324 A1* | 6/2005 | Tannhof | G06F 15/17368 712/10 |

(Continued)

FOREIGN PATENT DOCUMENTS

| | | | | |
|---|---|---|---|---|
| JP | 2008-021032 | | 1/2008 | |
| JP | 2008021032 | * | 1/2008 | ............... G03F 7/20 |
| WO | WO 2009/080310 | * | 7/2009 | ............... G03F 7/20 |

OTHER PUBLICATIONS

International Search Report for correspnding PCT Appl No. PCT/EP2010/004816, dated Aug. 22, 2011.

(Continued)

*Primary Examiner* — Mohamed Charioui
(74) *Attorney, Agent, or Firm* — Fish & Richardson P.C.

(57) ABSTRACT

A microlithographic projection exposure apparatus has a measuring device, by which a sequence of measurement values can be generated, and a processing unit for processing the measurement values. The processing unit has a processing chain which includes a plurality of digital signal processors. The first digital signal processor in the processing chain is connected to the measuring device to receive the sequence of measurement values. Each subsequent digital signal processor in the processing chain is connected to a respectively preceding digital signal processor in the processing chain. The digital signal processors are programmed so that each digital signal processor processes only a fraction of the measurement values and generates processing results therefrom, and forwards the remaining fraction of the measurement values to the respective next digital signal processor in the processing chain for processing.

20 Claims, 10 Drawing Sheets

(56) References Cited

U.S. PATENT DOCUMENTS

| | | | |
|---|---|---|---|
| 2007/0129824 A1* | 6/2007 | Sato | G03F 7/70525 |
| | | | 700/56 |
| 2007/0171425 A1* | 7/2007 | De Groot | G03F 7/70775 |
| | | | 356/478 |
| 2008/0205767 A1 | 8/2008 | Hoshino et al. | |
| 2008/0224251 A1 | 9/2008 | Troost et al. | |
| 2011/0055445 A1* | 3/2011 | Gee | G06F 1/0353 |
| | | | 710/260 |

OTHER PUBLICATIONS

Korean Office Action, with translation thereof, for corresponding KR Appl No. 10-2013-7005681, dated Feb. 2, 2016.

* cited by examiner

MICROLITHOGRAPHIC PROJECTION EXPOSURE APPARATUS

CROSS-REFERENCE TO RELATED APPLICATION

The present application is a continuation of, and claims benefit under 35 USC 120 to, international application PCT/EP2010/004816, filed Aug. 6, 2010. The contents of this application is hereby incorporated by reference in its entirety.

FIELD

The disclosure relates to a microlithographic projection exposure apparatus having a measuring device, by which a sequence of measurement values can be generated. In particular, the disclosure may be employed in projection exposure apparatus which include an optical component and an actuating device, which modifies a property of the optical component via a plurality of actuators, as is the case for example in a multi-mirror array.

BACKGROUND

Integrated electrical circuits and other microstructured components are conventionally produced by applying a plurality of structured layers onto a suitable substrate which, for example, may be a silicon wafer. In order to structure the layers, they are first covered with a photoresist which is sensitive to light of a particular wavelength range, for example light in the deep ultraviolet (DUV, deep ultraviolet) spectral range. The wafer coated in this way is subsequently exposed in a microlithographic projection exposure apparatus. A pattern of structures, which is arranged on a mask, is thereby imaged onto the photoresist with the aid of a projection objective. Since the imaging scale used for this imaging is generally less than 1, such projection objectives are often also referred to as reducing objectives.

After the photoresist has been developed, the photoresist layer is washed off so that the wafer remains covered by the photoresist only at the exposed positions. The wafer is then subjected to an etching process or doped with foreign atoms, so that the layer lying below the photoresist is structured according to the pattern on the mask. The developed photoresist still remaining is subsequently removed from the wafer. This process is repeated until all the layers have been applied onto the wafer.

The performance of the projection exposure apparatus being used is determined not only by the imaging properties of the projection objective, but also by an illumination system which illuminates the mask with the so-called projection light. To this end, the illumination system contains a light source, for example a laser operated in pulsed mode, and a plurality of optical elements which generate light bundles, converging on the mask at field points within a usually elongate illumination field, from the light generated by the light source. The individual light bundles have particular properties, which in general are adapted to the projection objective.

These properties include inter alia the angular irradiance distribution of the light bundles which respectively converge at a point on the mask plane. The term angular irradiance distribution describes the way in which the overall intensity of a light bundle is distributed between the different directions in which the individual rays of the light bundle strike the relevant point in the mask plane. If the angular irradiance distribution is furthermore specially adapted to the pattern contained in the mask, then the latter can be imaged with higher imaging quality onto the wafer covered with photoresist.

Other important properties of the projection light are the intensity distribution within the illumination field and the contour of the illumination field per se. Since, in the so-called scanner mode of the microlithographic projection exposure apparatus, both the mask and the wafer to be exposed are moved continuously relative to the illumination field, the integrated total intensity with which a particular region is intended to be exposed can be established by the contour of the illumination field perpendicular to the direction of the motion. The contour may for example be varied via a finger aperture, the individual fingers of which can be driven individually and during active operation. The respective intensities along the illumination field may, for example, be recorded by an intensity sensor in the mask plane and converted into a sequence of measurement values. With a suitable arrangement, for example via a beam splitter, the integrated total intensities can thus be monitored during operation.

Recently, the use of so-called multi-mirror arrays (MMAs, also referred to as micromirror arrays or mirror matrices) has furthermore been envisaged for illumination systems of microlithographic projection exposure apparatus. These multi-mirror arrays include a multiplicity of individually drivable micromirrors, in order to deviate individual sub-beams of the projection light in different directions. With the aid of the micromirrors, the respective light sub-beams of the projection light can thus be directed individually onto different positions in a pupil surface of the illumination system. Since the intensity distribution in the pupil surface of the illumination system crucially influences the angular irradiance distribution of the projection light, the angular irradiance distribution can be set more flexibly owing to the individual drivability of the micromirrors. Particularly in connection with so-called unconventional illumination settings, in which an annular region or a plurality of poles are illuminated in the pupil surface, the use of multi-mirror arrays makes it possible to adapt the angular irradiance distribution to the respective circumstances, and in particular to the mask to be projected, without for example diffractive optical elements having to be replaced.

Multi-mirror arrays are often produced as microelectromechanical systems (MEMS) via lithographic methods, such as are known from semiconductor technology. The typical structure sizes are sometimes a few micrometres. Known examples of such systems are, for example, multi-mirror arrays whose micromirrors can be tilted digitally about an axis between two end positions. Such digital multi-mirror arrays are often used in digital projectors for showing images or films.

For use in the illumination system of a microlithographic projection exposure apparatus, the micromirrors should however be capable of quasi-continuously adopting every tilt angle within a working angle range. The actuators, which induce tilting of the micromirrors, may for example be configured as electrostatic or electromagnetic actuators. With known electrostatic actuators, for example, the tilting of the micromirrors is based on a stationary control electrode and a mirror electrode applied on the back side of the micromirror attracting one another with a different strength according to the applied voltage. Using a suitable suspension and a plurality of actuators, the micromirror can therefore be tilted through any desired tilt angle.

Owing to stringent desired properties for the accuracy when tilting the micromirrors, the actuators accordingly are driven extremely precisely by drive electronics. Here, it should be noted that owing to the large number of individual mirrors in a multi-mirror array, for example 1000, which usually are driven by a plurality of actuators per mirror, such drive electronics are designed very efficiently. Particularly when using a regulator system, the drive electronics are capable of processing a rapid sequence of measurement values in order to achieve a sufficient regulating frequency so that even high-frequency perturbations can be compensated for.

In analogy with the multi-mirror arrays described above, the use of so-called faceted mirrors having a multiplicity of individual mirror facets has been considered for modern X-ray lithography projection exposure apparatus in both the illumination system and the projection objective. Since it is desired to monitor the deformation of these faceted mirrors at a lot of different points, measurement values are generated in rapid succession and actuators of the faceted mirror have to be driven as a function of these measurement values.

All these devices and methods involve rapid evaluation and processing of a multiplicity of measurement values occurring as a rapid sequence of measurement values which for the most part are mutually independent.

SUMMARY

The disclosure provides a device and a method with which a sequence of measurement values can be processed rapidly.

In one aspect, the disclosure provides a microlithographic projection exposure apparatus including a measuring device, by which a sequence of measurement values can be generated, and including a processing unit which, in order to process the measurement values, includes a processing chain that includes a plurality of digital signal processors. The first digital signal processor in the processing chain is connected to the measuring device in order to receive the sequence of measurement values. Each subsequent digital signal processor in the processing chain is connected to a respectively preceding digital signal processor in the processing chain. The digital signal processors are programmed so that each digital signal processor processes only a fraction of the measurement values and generates processing results therefrom and, with the exception of the last digital signal processor in the processing chain, forwards the remaining fraction of the measurement values to the respective next digital signal processor in the processing chain for processing.

According to the disclosure, it has been discovered that a rapid sequence of measurement values, at least some of which are preferably independent of one another, can be processed particularly efficiently in a processing chain consisting of at least two digital signal processors when the first digital signal processor in the processing chain receives all the measurement values but itself processes only the fraction of the measurement values with which it can cope within a particular period of time. The remaining fraction of the measurement values is forwarded to the subsequent digital signal processors. It is in this case advantageous that, as considered from outside the processing chain, the first digital signal processor receives all the measurement values and it is therefore not necessary to provide additional circuits which distribute the measurement values between the digital signal processors, since the digital signal processors are connected to one another and programmed so that they undertake the forwarding of the measurement values by themselves. For the rest of the processing unit, the distribution of the processing between a plurality of digital signal processors can therefore take place fully transparently.

Normally, the digital signal processor which no longer forwards any measurement values will be the last digital signal processor of the processing chain. It may, however, also be the case that digital signal processors lying further behind in the processing chain no longer need to process any measurement values if, for example, only simpler processing of the measurement values is used at a particular time or in a particular mode.

Here, the term digital signal processors or DSPs refers to processors having a processor architecture adapted for rapid signal processing. In particular, the digital signal processors are real-time capable, i.e. they are reliably able to process a particular amount of data per unit time. The digital signal processors may include the structural functional units for this, which will be explained in more detail below, fully integrated on a single chip. They may, however, also be produced for example as processor circuit boards which include the individual functional units such as arithmetic logic unit, memory or input and output drivers with some or all of them being separate modules.

As is generally conventional in electrical and circuit technology, terms in this context such as "connect", "forward" or "deliver" include at least indirect connection, forwarding or delivery, since active or passive components for level matching may often be interconnected in the scope of a connection, and a connection should therefore always be interpreted as also referring to an indirect connection. This applies in particular because there are both digital signal processors which can be connected directly to one another by electrical lines, as well as digital signal processors for which additional communication circuits are provided in order to allow forwarding from one digital signal processor to another.

In what follows, terms such as "preceding" or "subsequent" in relation to the processing chain refer to the direction in which the measurement values are forwarded through the processing chain.

With such a processing chain, it is possible to process a large number of rapidly successive measurement values in real-time. For example, in a microlithographic projection exposure apparatus the measurement values of an intensity sensor, in particular a spatially resolved intensity sensor, may be evaluated, filtered or merely just integrated in order to provide information for a user. The processing results obtained may be output individually by each digital signal processor, or likewise by forwarding in the chain, and for example made available to the user in real-time via a display device.

On the other hand, such real-time processing also allows the processing results to be fed back within the scope of a regulation process to an actuating device of the microlithographic projection exposure apparatus. According to another embodiment of the disclosure, the projection exposure apparatus therefore includes an optical component and an actuating device, which includes a plurality of actuators that act on the optical component, the processing results of the processing unit being deliverable to the actuating device in order to modify a property of the optical component.

The measuring device can thus directly or indirectly measure properties of an optical component of the microlithographic projection exposure apparatus. The measurement values are subsequently processed with the aid of the processing unit and delivered to the actuating device, which finally modifies the properties of the optical component. A closed control loop is thus obtained, in which elaborate digital regulation algorithms can be used for the regulation process owing to the efficient processing in the processing unit. The processing results in this case correspond to the regulator output variables which are used to drive the controlling elements, i.e. the actuators of the actuating device. For example, the measurement values of a spatially resolved intensity sensor may be used in order to adjust a finger aperture in the illumination system of the projection exposure apparatus during operation. In particular, owing to the efficient processing chain, the regulator output variables for a multiplicity of actuators can be provided by the described processing unit.

The advantages of the processing unit, however, become particularly significant in another embodiment of the disclosure according to which the optical component includes a plurality of mirrors which can be adjusted, preferably individually, with the aid of the actuators. In particular, the mirrors may each be tiltable about one or two axes.

Such an optical component including a plurality of mirrors is, for example, a multi-mirror array, which may for example be used in the illumination system of the projection apparatus. In order to orientate the many mirrors, which can usually be tilted independently of one another, in the multi-mirror array, the mirror settings should be monitored and regulated. Owing to the large number of mirrors, the measuring device which is used to monitor the multi-mirror array delivers a rapid sequence of mutually independent measurement values. Although each mirror furthermore has a multiplicity of actuators, rapid real-time regulation of the mirror settings is made possible with the aid of the described processing unit. To this end, for example, the processing results may be delivered to power electronics which supply the actuators of the multi-mirror array. The actuators with the associated power electronics then constitute the actuating device, which modifies the properties of the optical components.

According to another embodiment of the disclosure, the processing unit includes an input via which all the measurement values can be received from the measuring device. The first digital signal processor in the processing chain furthermore includes a measurement data input, which is connected to the input of the processing unit. The first digital signal processor in the processing chain furthermore includes a measurement data output, via which the remaining fraction of the measurement values can be forwarded to the next digital signal processor in the processing chain. Each subsequent digital signal processor in the processing chain likewise includes a measurement data input, which is connected to a measurement data output of the respectively preceding digital signal processor in the processing chain and via which it receives the remaining fraction of the measurement values forwarded by the respectively preceding digital signal processor in the processing chain.

The inputs and outputs of the digital signal processors, which are considered here as logical inputs and outputs independently of their actual configuration, for example to form a serial or parallel, uni- or bidirectional digital connection on an optical, electrical or electromagnetic support medium, allow simple setup of the processing chain. The digital signal processors are programmed so that the first digital signal processor in the processing chain initially receives all the measurement values at its measurement data input, and forwards the fraction of the measurement values which it does not process via its measurement data output to the measurement data input of the next digital signal processor. Each digital signal processor of the processing chain could then directly output the processing results generated by it.

According to another embodiment of the disclosure, however, each digital signal processor includes a result output via which generated processing results can be output. The processing unit furthermore includes an output via which all the processing results of the processing chain can be output and which is connected to the result output of the first digital signal processor in the processing chain. Each digital signal processor, with the exception of the last digital signal processor in the processing chain, includes a result input which is connected to the result output of the respective next digital signal processor in the processing chain. Each digital signal processor, with the exception of the last digital signal processor in the processing chain, is furthermore programmed so that, at its result output, it outputs its processing results as well as processing results which have been generated by the subsequent digital signal processors in the processing chain and which it receives at its result input. Finally, the last digital signal processor in the processing chain is programmed so that it outputs only its own processing results at its result output.

The processing results of all the digital signal processors are thus output at the output of the processing unit by travelling through the processing chain in the opposite direction to that in which the measurement values are received and forwarded in the processing chain. One of the advantages of such a procedure is that the processing results are provided as a sequence of processing results in the form of an outgoing data stream, which may then for example be transmitted to an actuating device.

Another possibility consists in passing the processing results through the processing chain in the same direction as the measurement values. To this end, each digital signal processor includes a result output, via which generated processing results can be output, and the processing unit includes an output, via which all the processing results of the processing chain can be output and which is connected to the result output of the last digital signal processor in the processing chain. Furthermore, each digital signal processor, with the exception of the first digital signal processor in the processing chain, includes a result input which is connected to the result output of the respectively preceding digital signal processor in the processing chain. Each digital signal processor, with the exception of the first digital signal processor in the processing chain, is in this case programmed so that, at its result output, it outputs its processing results as well as processing results which have been generated by the preceding digital signal processors in the processing chain and which it receives at its result input. Finally, the first digital signal processor in the processing chain is programmed so that it outputs only its own processing results at its result output.

This output of the processing results with data streams travelling in the same direction in the processing chain has the advantage that, irrespective of the digital signal processor in which the processing results have been generated, they have the same delays which are due to the forwarding in the processing chain.

According to another embodiment of the disclosure, at least one further digital signal processor, which itself likewise processes only a fraction of the received measurement values and forwards the remaining fraction, is connected between the first digital signal processor in the processing chain and the last digital signal processor in the processing chain.

This allows the available computation capacity of the processing unit to be increased in a straightforward way by inserting further digital signal processors into the chain. The sequence of measurement values can thus be subdivided into smaller fractions. The more digital signal processors the processing chain includes, the smaller is the number of measurement values which each individual digital signal processor has to process, so that for example more complex processing operations or more rapid sequences of measurement values can be processed.

With data streams travelling in opposite directions in the processing chain, according to another embodiment of the disclosure further digital signal processors are preferably interconnected by the at least one further digital signal processor including a measurement data input, which is adapted to receive a fraction of the measurement values from a measurement data output of a preceding digital signal processor in the processing chain, and a measurement data output which is adapted to transfer a fraction of the measurement values, not to be processed by the at least one further digital signal processor, to a measurement data input of a subsequent digital signal processor in the processing chain. The at least one further digital signal processor furthermore has a result input, which is adapted to receive processing results from a subsequent digital signal processor in the processing chain, and a result output which is adapted to transfer processing results generated by the at least one further digital signal processor, and the processing results which come from the subsequent digital signal processors in the processing chain, to the result input of a preceding digital signal processor in the processing chain.

If, however, the processing results are passed through the processing chain in the same direction as the measurement values, then according to another embodiment of the disclosure the at least one further digital signal processor includes a measurement data input, which is adapted to receive a fraction of the measurement values from a measurement data output of a preceding digital signal processor in the processing chain, and a measurement data output which is adapted to transfer a fraction of the measurement values, not to be processed by the at least one further digital signal processor, to a measurement data input of a subsequent digital signal processor in the processing chain. The at least one further digital signal processor furthermore has a result input, which is adapted to receive processing results from a preceding digital signal processor in the processing chain, and a result output which is adapted to transfer processing results generated by the at least one further digital signal processor, and the processing results which come from the preceding digital signal processors in the processing chain, to the result input of a subsequent digital signal processor in the processing chain.

According to another embodiment of the disclosure, each digital signal processor includes two inputs and two outputs.

By corresponding programming of the digital signal processors, the two inputs and the two outputs can then be adapted for the reception, output or forwarding of the measurement values and/or the processing results, according to the way in which the digital signal processors are interconnected. For the two digital signal processors at the ends of the processing chain, one or other input or output may in this case remain unused so that identical digital signal processors can be used in the digital processing unit.

According to another embodiment of the disclosure, each digital signal processor is assigned a memory and a memory access unit.

The memory can be used for buffering the measurement values and other data. In particular, intermediate processing results may be stored for later processing steps. Each digital signal processor may be assigned its own memory. The memory may, however, also be configured as a jointly used memory for all the digital signal processors, which is optionally subdivided into smaller memory ranges. A memory access unit, for example a DMA controller, is used to receive the data and copy them into the memory and to copy and output the data from the memory, and thus reduces the load on the arithmetic logical unit of the digital signal processor. Both the memory and the memory access unit may be contained in the digital signal processor, for example in the processor chip itself or as part of a processor circuit board.

According to another embodiment of the disclosure, the digital signal processors are adapted for cyclic operation and, by each digital signal processor in each clock cycle, measurement values are received, measurement values are processed to form processing results and processing results are output.

Modern digital signal processors are capable of receiving and/or transmitting data, and processing already received data in parallel with this. Cyclic operation has the advantage that it allows so-called data-driven systems, the operating mode of which is oriented towards the data produced. In the present case, for example after a particular number of measurement values have been received and transferred into the memory, a so-called interrupt is triggered. The processing of the measurement values which have been read in, with the aid of the arithmetic logic units of the digital signal processors, starts after this interrupt. At the same time, for example with the aid of a memory access unit, further measurement values are read in and transferred into another memory range. Already available processing results are furthermore provided at an output. After a further number of measurement values which have been read in, another interrupt is triggered which marks the end of the preceding clock cycle and the start of the next clock cycle.

According to another embodiment of the disclosure, the sequence of measurement values includes atomic measurement value groups which can be processed independently of one another. The first digital signal processor in the processing chain is furthermore programmed so that the sequence of measurement values is received while being subdivided into bursts, a burst including a number of independent measurement value groups which is greater than the number of digital signal processors.

In many applications, the generated processing results are dependent on the processing of a plurality of measurement values. This is the case for example when regulating the mirror settings of the mirrors of a multi-mirror array, through which the two tilt angles about the two axes of a mirror are processed together in order to correspondingly determine the regulator output variables for this mirror. It is therefore advantageous to regard these measurement values as cohesive measurement value groups. It is difficult for the processing of such an atomic group of mutually dependent measurement values to be distributed and carried out on two different digital signal processors. Each digital signal processor in the processing chain should therefore read in and process such measurement value groups fully, and likewise only transfer complete measurement value groups when forwarding to subsequent digital signal processors in the processing chain. Similar dependency considerations apply to the output of the processing results, when for example a plurality of actuators are driven in order to tilt a mirror.

In cyclic operation, however, it is furthermore advantageous not merely to read the measurement values of only one measurement value group for processing into a digital signal processor, or into the memory assigned to it, but rather to read in a plurality of measurement value groups in one clock cycle and process them together in the next clock cycle. Although the individual clock cycles will therefore be longer, and concomitantly the latency times of processing will be greater, fewer interrupts will be triggered in this way, which is advantageous in relation to the performance of the digital signal processors being used.

According to another embodiment of the disclosure, each digital signal processor is adapted so that it generates processing results for each measurement value group over a plurality of clock cycles.

In a regulation process, for example, this will allow regulator output variables to be output more frequently than measurement values are read in. It is thus possible to use regulation processes which, for example, operate with a state estimator or are partially based on a open-loop control process. Pulse-width modulation methods can furthermore be used to increase the resolution of a digital-analogue conversion in an actuating device, or the signal profile of the actuating device can simply be smoothed by the higher output rate.

According to another embodiment of the disclosure, the digital signal processors of the processing unit are programmed so that the processing results and/or the measurement values are output and received while being interleaved.

With the processing results being output in a different order than the associated measurement values were received, it is possible to reduce fluctuations of the latency times. For example, the order of the outgoing processing results belonging to different measurement value groups within a burst may be different from the order of the incoming measurement value groups, so that fluctuations in the latency times due to the length of the bursts are avoided. Such a change in the order may be carried out both in the incoming data stream of the measurement values and in the outgoing data stream of the processing results.

The disclosure furthermore provides an expansion unit for expanding a processing unit of a microlithographic projection exposure apparatus. The expansion unit includes a digital signal processor. The digital signal processor includes a measurement data input which is adapted to receive a fraction of the measurement values from the preceding digital signal processor in the processing chain. The digital signal processor furthermore includes a measurement data output which is adapted to transfer a fraction of the measurement values, not to be processed by this digital signal processor, to a measurement data input of the next digital signal processor in the processing chain. The digital signal processor furthermore has a result input, which is adapted to receive processing results from the next or preceding digital signal processor in the processing chain, and a result output which is adapted to transfer processing results generated by this digital signal processor, and the processing results which come from the next or preceding digital signal processor in the processing chain, respectively to the result input of the preceding or next digital signal processor in the processing chain.

With the aid of such an expansion unit, the performance of the processing unit can be scaled flexibly. In particular, for later upgrading to more complex open-loop control and closed-loop regulation algorithms, the overall concept of the processing unit can be maintained so that in design terms no full redesign of the processing unit is involved. The scalability of the processing unit moreover also allows simple adaptation when using different optical components. For example, via the expansion unit the processing unit can be adapted flexibly, and in particular retrospectively, to multi-mirror arrays having a different number of mirrors.

In some embodiments, the disclosure provides a method for processing a sequence of measurement values in a microlithographic projection exposure apparatus, having the following steps: providing a processing unit including a plurality of digital signal processors, which are interconnected to form a processing chain; receiving the sequence of measurement values by the first digital signal processor in the processing chain; processing the measurement values, wherein each digital signal processor processes only a fraction of the measurement values and generates processing results therefrom. Each digital signal processor, with the exception of the last digital signal processor in the processing chain, furthermore forwards the remaining fraction of the measurement values to the respective next digital signal processor in the processing chain for processing.

As already explained above in relation to the microlithographic projection exposure apparatus, rapid sequences of measurement values can be processed by a processing unit which uses such a processing method. The method steps may also be carried out simultaneously or at least overlapping in time, depending on the digital signal processors being used.

According to another embodiment of the disclosure, the processing results are used to modify a property of an optical component, particularly in order to drive actuators of a multi-mirror array.

The method can therefore be used to regulate any desired adjustable optical components. It is particularly advantageous to use the method according to the disclosure in the scope of applications in which many different measurement values are generated and a large number of actuators have to be driven. This may, for example, include shaping the surface of objective mirrors or faceted mirrors of EUV projection exposure apparatus, regulating the intensity via finger apertures and, in particular, driving multi-mirror arrays in order to shape pupils in the illumination system.

Finally, according to another aspect of the disclosure the described concepts of data processing can be implemented in an illumination system for use with microlithographic projection exposure apparatus.

BRIEF DESCRIPTION OF THE DRAWINGS

Other features and advantages will be found in the following description of preferred exemplary embodiments with reference to the drawings, in which.

DESCRIPTION OF PREFERRED EXEMPLARY EMBODIMENTS

I.

Structure of the Illumination System

Figure 1:
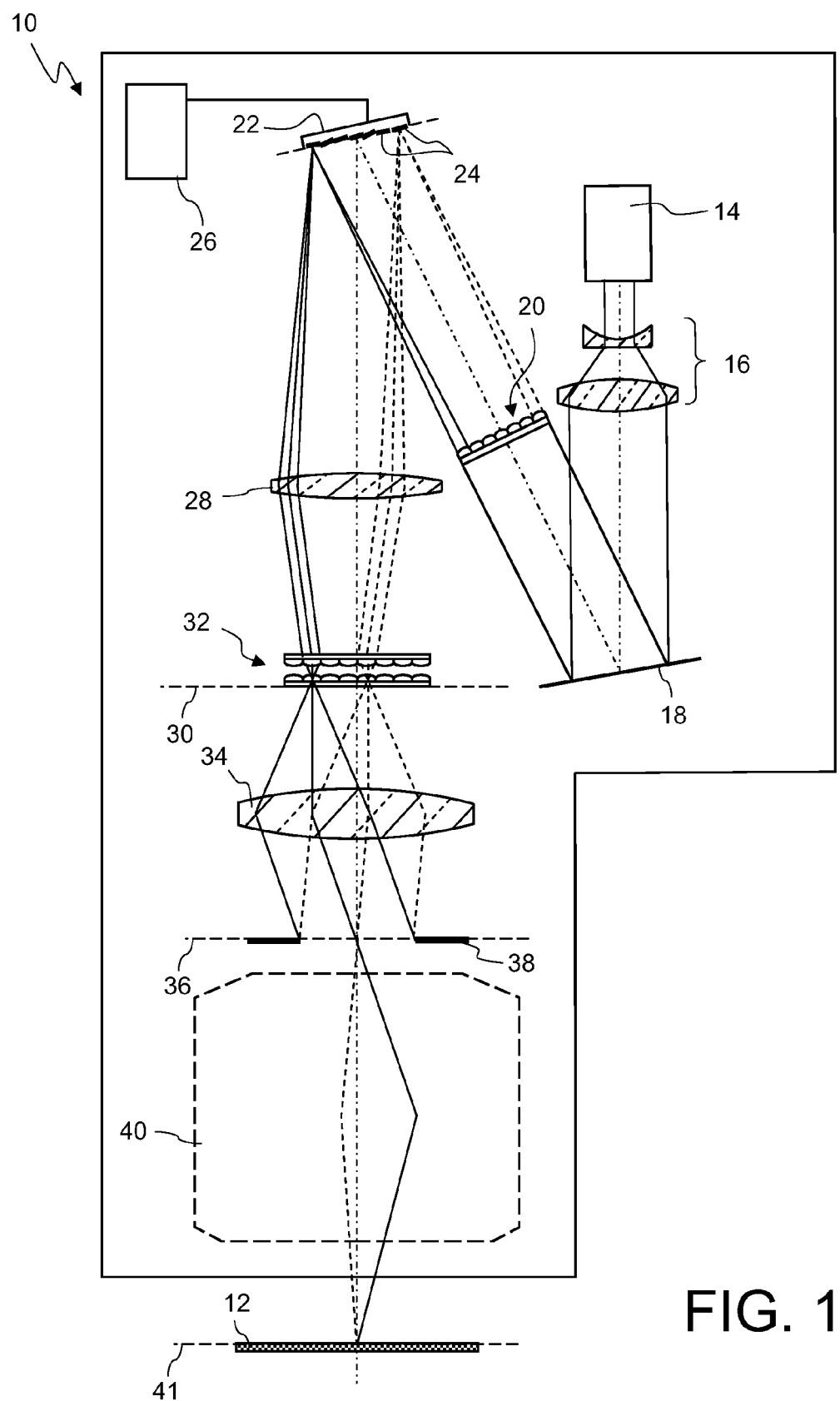
FIG. 1 shows a simplified meridional section through an illumination system of a microlithographic projection exposure apparatus including a multi-mirror array.

FIG. 1 shows an illumination system 10 of a microlithographic projection exposure apparatus in a highly simplified meridional section. The illumination system 10 is used to illuminate a mask 12, on which there are lithographic structures to be imaged, with projection light. A projection objective (not shown) then images the illuminated structures onto a wafer coated with a photosensitive resist, usually on a reduced scale.

One important factor which crucially influences the imaging properties of a microlithographic projection exposure apparatus is the angular irradiance distribution of the projection light. This is intended to mean the distribution of the total intensity of the light striking a mask point, between the different incidence angles at which the light strikes the mask point. In particular, it is desirable to adapt the angular irradiance distribution to the type of structures to be illuminated, in order to achieve maximally optimal imaging.

To this end the illumination system 10 includes a multiplicity of optical elements in its beam path, which in FIG. 1 are represented only in a highly simplified way or not at all.

The projection light generated by a laser 14 or another light source is initially expanded by first optics 16 and directed by a plane mirror 18 onto a microlens array 20. The plane mirror 18 is primarily used to keep the external dimensions of the illumination system 10 compact.

The microlens array 20 subdivides the projection light into individual light sub-beams and directs these onto adjustable micromirrors 24 of a subsequent multi-mirror array 22, which will be explained in more detail below with reference to FIG. 2.

The individual micromirrors 24 can preferably be tilted so that the light sub-beams generated by the microlens array 20 travel, via second optics 28, through a pupil surface 30 at freely selectable positions. A fly's eye integrator 32 arranged close to this pupil surface 30 generates a multiplicity of secondary light sources in the pupil surface 30 which, via the third optics 34, uniformly illuminate an intermediate field plane 36 in which adjustable aperture elements 38 are arranged. The third optics 34 produce a correlation between angles in the pupil surface 30 and positions in the intermediate field plane 36. The latter is imaged by an objective 40 onto a mask plane 41, in which the mask 12 is arranged. The intensity distribution in the pupil surface 30 therefore determines the angular irradiance distribution not only in the intermediate field plane 36, but also in the mask plane 41.

By different tilting of the individual micromirrors 24 of the multi-mirror array 22, it is therefore possible to adjust the angular irradiance distribution very flexibly. With suitable driving of the micromirrors 24, the angular irradiance distribution can even be varied during an exposure.

II.

Structure of the Multi-Mirror Array

Figure 2:
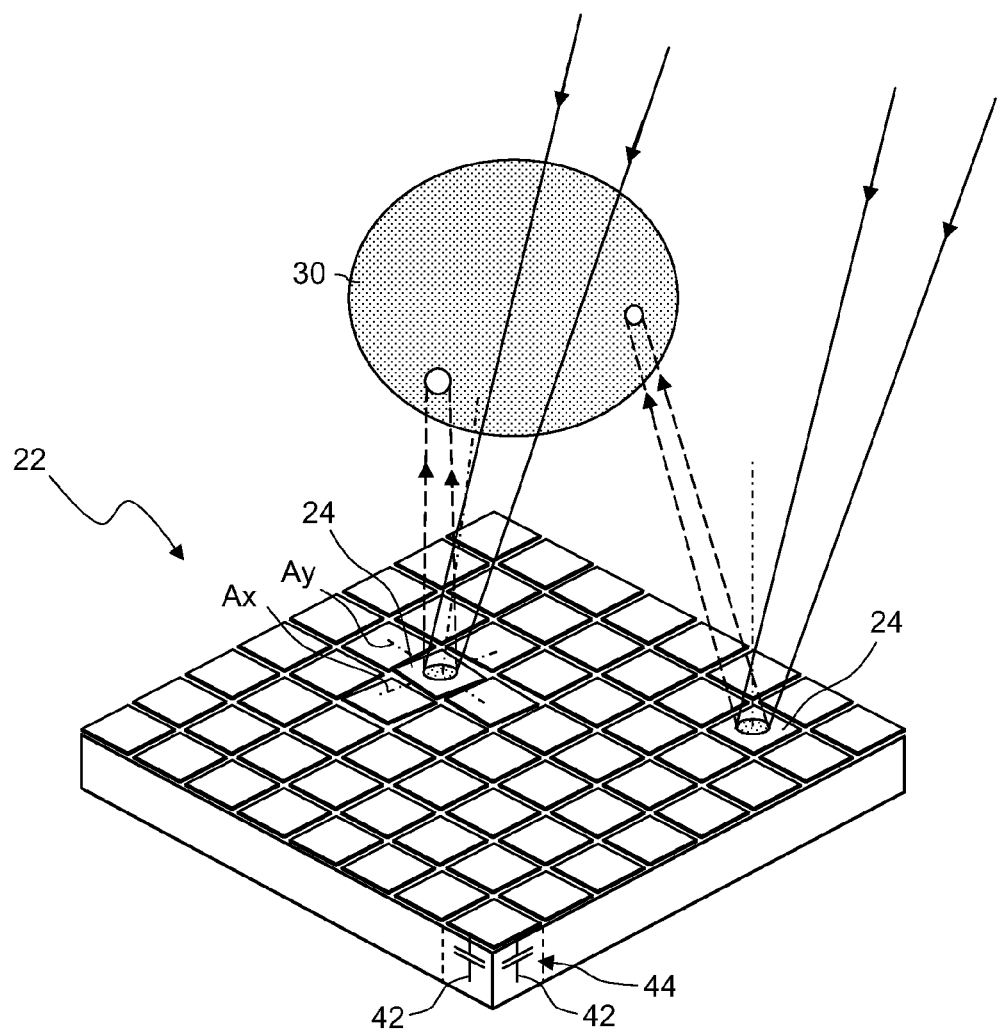
FIG. 2 shows a simplified perspective representation of the multi-mirror array including a plurality of mirrors driven by actuators.

FIG. 2 shows a simplified perspective representation of the multi-mirror array 22, in which the individual micromirrors 24 are plane and have a square contour.

In order to be able to direct an incident light sub-beam, which is generated by a lens of the microlens array 20 lying upstream in the beam path, onto any desired positions within the pupil surface 30, each micromirror 24 is mounted so that it can tilt about two tilt axes Ax and Ay. The tilting per se about the tilt axes Ax, Ay can be controlled via actuators 42 (represented only symbolically), for example electrostatic actuators, in which case each micromirror 24 may generally be assigned its own set of actuators so that the micromirrors 24 can be driven individually. A micromirror 24 and its associated actuators 42 can therefore be combined into a mirror unit 44.

The greater the number of mirror units 44 in a multi-mirror array 22 is, the more finely the intensity distribution can be resolved in the pupil surface 30. Multi-mirror arrays 22 including several thousand micromirrors 24, which can be tilted about two tilt axes Ax, Ay, may be envisaged. Such multi-mirror arrays 22 may, for example, be fabricated in MEMS technology and employ various actuation methods.

III

Structure of the Drive System

Figure 3:
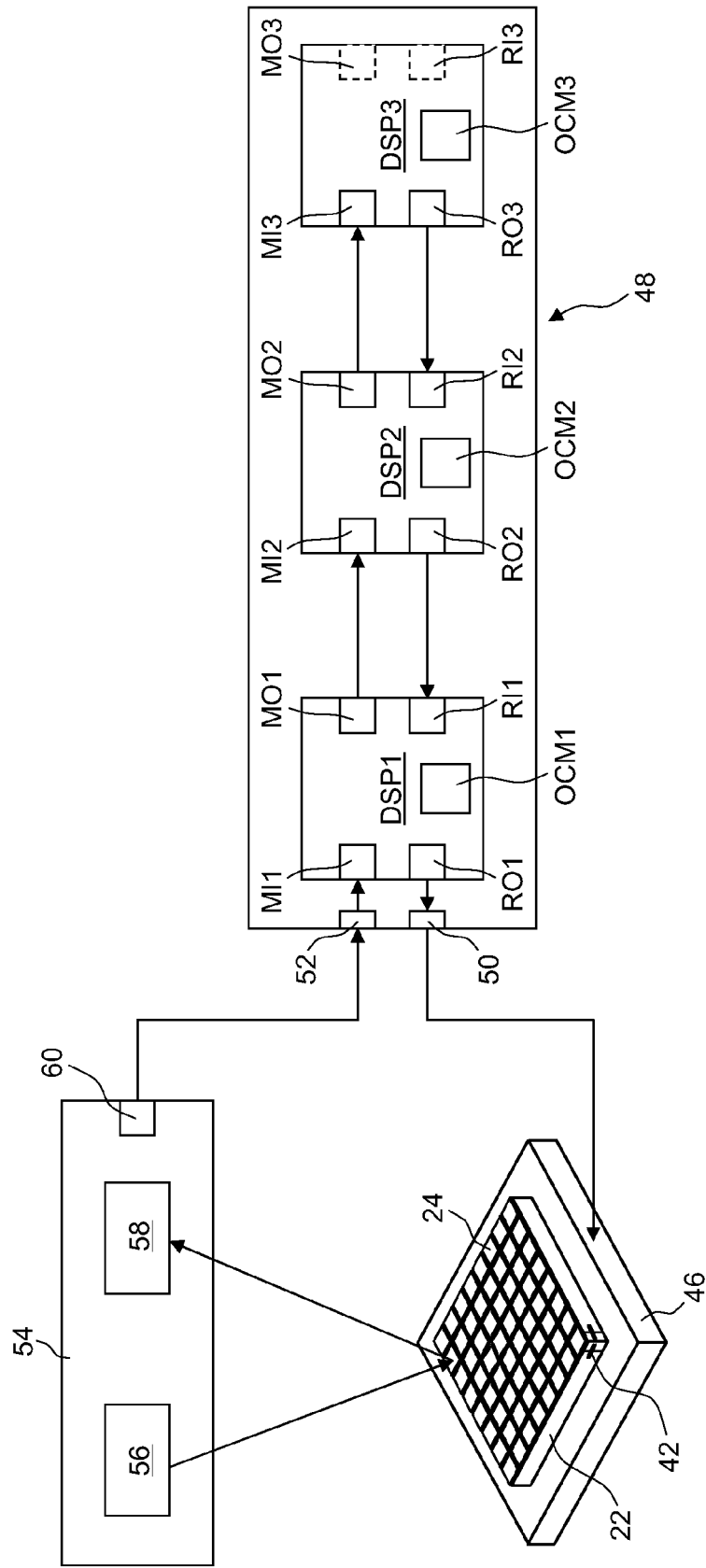
FIG. 3 shows a schematic representation illustrating how a processing system which includes three digital signal processors (DSPs) interacts with various components of the illumination system in order to orientate the individual mirrors of the multi-mirror array.

FIG. 3 shows in a schematic representation the way in which various components of the illumination system 10 interact in order to drive the multi-mirror array 22.

The multi-mirror array 22 with the micromirrors 24 is connected to power electronics 46 which generate the analogue control signals used to drive the actuators 42. In order to ensure that the electrical interference on the analogue control signals is small, the power electronics 46 are arranged as close as possible to the multi-mirror array 22 so that the propagation distances of the analogue control signals are short. For further details in this regard, reference is made to the application PCT/EP2008/010918 which is hereby incorporated into the present application by reference.

The power electronics 46 for their part receive information about the way in which the actuators 42 of the micromirrors 24 are intended to be driven, in digital form from a digital control and regulation unit which will be referred to below as a processing unit 48 for brevity. To this end, the processing unit 48 has a digital output 50 which is connected to the power electronics 46, for example via a high-speed bus system.

The mirror settings of the individual micromirrors 24 can thus be controlled via the processing unit 48, which is connected to a user interface via a communication connection (not shown), and the power electronics 46.

In order to ensure that the actual mirror settings of the individual micromirrors 24 correspond to desired mirror settings, which are established with the aid of the user interface, at an input 52 the processing unit 48 receives measurement values from a measuring device 54 which measures the actual mirror settings.

Owing to the desired accuracies and speeds with which it is possible to adjust the micromirrors 24, an optical measuring system including a separate light source 56 and a position-sensitive detector 58 is employed as the measuring device 54. To this end, the light source 56 sends measurement light from an accurately defined direction onto the individual micromirrors 24, this light being reflected by them and detected by the detector 58. Depending on the specific configuration, the separate light source 56 and the detector 58 may include a plurality of individual light sources and/or individual detectors, for example in order to achieve scanning rates of about 1 kHz for 4096 mirrors.

In the exemplary embodiment shown, the evaluation of the signals coming from the detector 58 is carried out entirely inside the measuring device 54. The already fully processed measurement values, which essentially correspond to the mirror settings of the individual micromirrors 24, are then transmitted digitally to the processing unit 48 via an interface 60, which is connected to the input 52 of the latter. The measurement values thus reach the processing unit 48 as a sequence of measurement values in a single serial data stream.

It is, however, also possible for the analogue signals coming from the detector 58 merely to be processed for the purpose of error-free data transfer by an analogue-digital converter and transferred to the processing unit 48. In this case, the processing unit 48 additionally undertakes the evaluation of the signals coming from the detector 58, i.e. determination of the actual mirror settings, which would otherwise have been carried out in the measuring device 54. It is thereby possible to obviate a computation unit in the measuring device 54 and, instead, jointly use the computation capacity in the processing unit 48, which can be expanded to virtually any desired extent as will be explained in more detail below. This is advantageous in particular when determination of the mirror settings from the signals coming from the detector 58 involves a great deal of computation capacity. If it is merely desired to monitor the mirror settings, for example in order to output them on the user interface, the processing of the signals coming from the detector 58 in the processing unit 48 may even be limited to determination of the mirror settings.

IV

Processing Unit

Besides peripheral electrical circuits (not shown), for example electrical power supplies and a communication mechanism, the processing unit 48 includes as its main components for evaluating the measurement values three identical digital signal processors (DSPs) DSP1, DSP2 and DSP3 with internal memories OCM1, OCM2, OCM3 (also known as "on-chip memories"), which are interconnected to form a processing chain.

In order to set up the processing chain, the first digital signal processor DSP1 in the processing chain includes a measurement value input MI1, which is connected to the input 52 of the processing unit 48 and to which all the measurement values transferred to the processing unit 48 are thus applied.

The first digital signal processor DSP1 furthermore includes a measurement value output MO1, which is connected to a measurement value input MI2 of the second digital signal processor DSP2 following next in the processing chain. The second digital signal processor DSP2, which acts as the central part of the processing chain, for its part in turn includes a measurement value output MO2 via which the second digital signal processor DSP2 is connected to a measurement value input MI3 of the third and last digital signal processor DSP3 of the processing chain.

For output of the results generated by the processing, the processing chain in the exemplary embodiment of FIG. 3 is run through in the opposite direction to the measurement values.

Thus, the third digital signal processor DSP3 includes as a result output RO3 which is connected to a result input RI2 of the preceding second digital signal processor DSP2. In order to output its own results and forward the results of the third digital signal processor DSP3, this second digital signal processor DSP2 likewise includes a result output RO2 which is connected to a result input RI1 of the preceding first digital signal processor DSP1. Lastly, the first digital signal processor DSP1 in the processing chain includes a result output RO1 which is connected to the output 50 of the processing unit 48 and via which the results of the entire processing chain are output, or forwarded.

As already mentioned above, the connections described here between the digital signal processors DSP1, DSP2 and DSP3 are direct or indirect connections. Connections which are particularly fast and simple to produce may, however, be achieved by digital signal processors which by their design already provide direct connections with one another. For this reason, three identical TigerSHARC DSPs from the company Analog Devices are used in this exemplary embodiment.

The TigerSHARC DSP from the company Analog Devices has four so-called link ports, via which the Tiger-SHARC can set up four bidirectional serial connections, so-called full duplex links, respectively with a 500 MB/s transfer rate per direction. Since the above-described inputs and outputs for measurement values and results MI1, MO1, MI2, MO2, MI3, RO3, RI2, RO2, RI1, RO1 represent logical inputs and outputs, an input and an output may in each case be produced via a single link port so that two link ports of a TigerSHARC DSP are respectively used in order to set up the processing chain.

As represented by dashes in FIG. 3, a measurement output MO3 and a result input RI3 of the third digital signal processor DSP3 are not used in this exemplary embodiment since the third digital signal processor DSP3 is the last element of the processing chain. Only one link port of the TigerSHARC DSP used there is therefore employed.

V

The Control and Regulation Scheme

Figure 4:
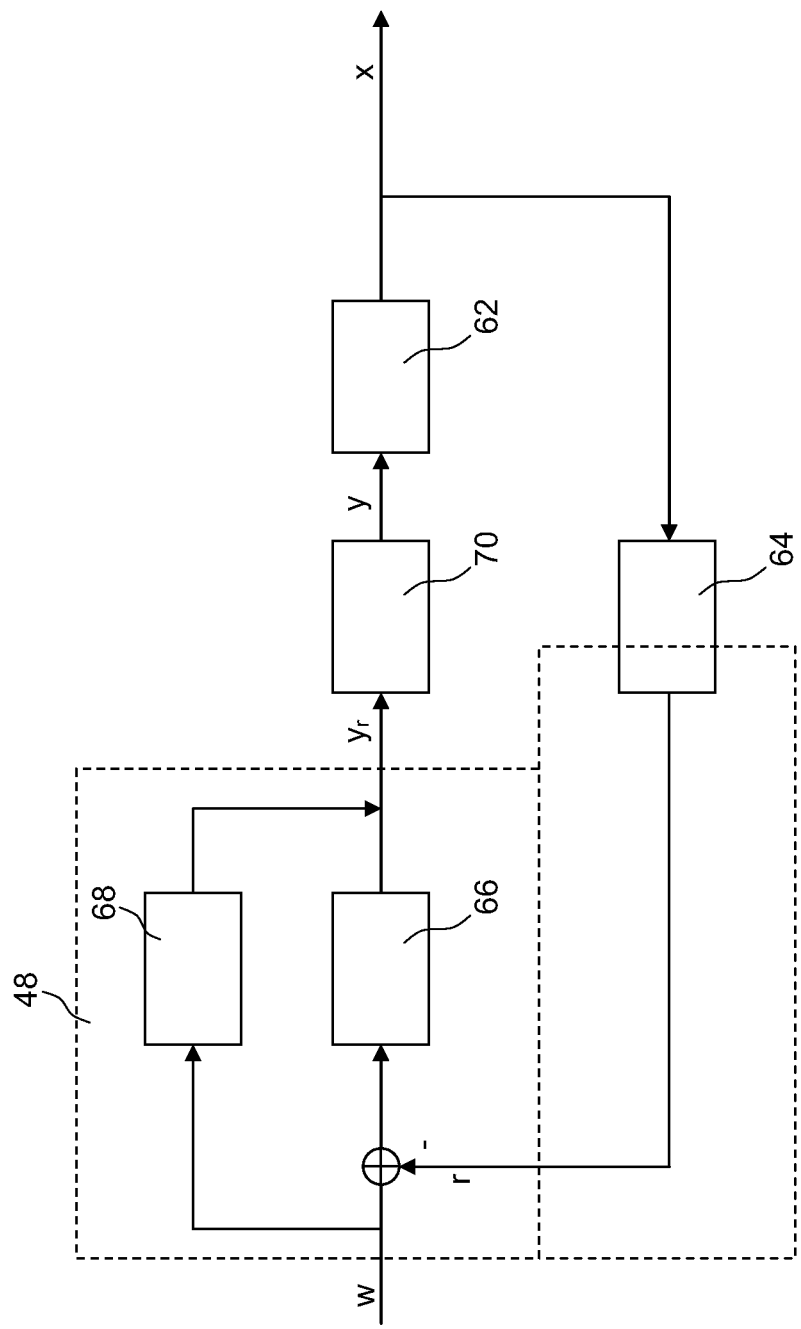
FIG. 4 shows a block representation of a control loop, the individual functional blocks of which are embodied by the various components of the illumination system.

The various components, shown in FIG. 3, of the illumination system 10 represent a closed control loop and can be assigned to the different functions existing in a standard control loop. The scheme of such a control loop is shown in FIG. 4.

The micromirrors 24 represent a controlled system 62 in the context of the control loop, the mirror settings corresponding to a controlled variable x of the control loop.

Owing to the large number of micromirrors 24, and because the mirror setting of an individual micromirror 24 already includes two tilts about the two tilt axes Ax, Ay, the controlled variable x and further corresponding variables, which will be explained below, may be considered as vectors so that, in abstract terms, there are a multiplicity of control loops in parallel.

In principle, in the scope of a regulation process, the individual components of these vectors may be considered as fully independent of one another. It is, however, advantageous to regard at least the mirror settings of an individual micromirror 24 about the two tilt axes Ax, Ay as mutually dependent since, for example, mechanical perturbations or vibrations in the suspension of the micromirror 24 often affect both tilt axes Ax, Ay simultaneously. Furthermore, depending on the actuators 42 and actuation methods used for adjusting the mirror settings, crosstalk may occur between the two components so that here again there is a dependency which should accordingly be taken into account within the regulation process. Similarly, micromirrors 24 in a particular region of the multi-mirror array 22 could also be assumed to be mutually dependent in the regulation algorithm, for example in order to take account of crosstalk between the individual micromirrors 24.

As already mentioned in the introduction, these dependencies have an effect on the way in which the processing of the measurement values in the processing unit 48 is distributed between the various digital signal processors.

The controlled variable x is recorded by a measuring element 64, in this case the measuring device 54, and fed back to a regulator 66 as a feedback variable r, which corresponds to the measurement values sent from the interface 60 to the input 52 after the evaluation in the measuring device 54.

The function of the regulator 66 together with a feedforward controller 68 is carried out by the digital control and regulation algorithms in the processing unit 48. To this end, the processing unit 48 is supplied directly (or indirectly by switching between desired mirror setting values stored inside the processing unit 48) by the user interface (not shown) with a reference variable w, which the controlled variable x is intended to follow with a predetermined dependency, an asymptotic dependency usually being desired.

As represented by dashes in FIG. 4 and already explained above, the processing unit 48 may undertake part of the function of the measuring element 64, if the measuring device 54 passes on the signals received by the detector 58 unprocessed to the processing unit 48 for evaluation.

As a result of the regulator 66 in conjunction with the feedforward controller 68, the processing unit 48 outputs at its output 50 the so-called regulator output variable $y_r$, which is transferred as a serial data stream to the power electronics 46, which provide the analogue control signals for the actuators 42. The power electronics 46 and the actuators 42 therefore represent a controlling element 70 of the control loop, so that the force exerted by the actuators 42 corresponds to a manipulated variable y acting on the controlled system 62.

Often, for simplification, the controlling element 70 is jointly incorporated into the controlled system 62 and the values described here as the regulator output variable $y_r$, which are transferred from the regulator to the controlled system 62, are referred to as the manipulated variable y or manipulated values. However, since the definition used to define the processing results output by the processing unit, which are transferred to an actuating device, is not of importance for the inventive concept, the designation as regulator output variables $y_r$ will be kept below.

Throughout the control loop, and particularly in the mechanical micromirrors 24 and the analogue parts of the power electronics 46 and the measuring device 54, perturbations z may occur which is compensated for by sufficiently rapid repetition frequencies of the control loop.

In the present exemplary embodiment, repetition frequencies of 1 kHz or more are achieved for a multi-mirror array 22 including 4096 micromirrors 24. If, for each micromirror 24, the measuring device 54 delivers a digital value which is only 16 bits long for the tilts respectively about one of the two tilt axes Ax, Ay (i.e. 32 bits=4 bytes are generated for each micromirror 24), then the processing unit 48 is therefore be capable of reliably processing a data stream of about 16 Mbyte/s.

Assuming that each micromirror 24 is assigned three actuators 24, which are driven via 16 bit digital values, then in respect of the outgoing data stream the processing unit 48 is in fact be capable of processing at least 24 Mbyte/s. The regulator output variable $y_r$, however, may also be output more often than is dictated by the repetition frequency of the control loop, if for example pulse-width modulation is used in order to increase the resolution of the manipulated values y.

VI

Processing Unit—Incoming Data Stream

Figure 5:
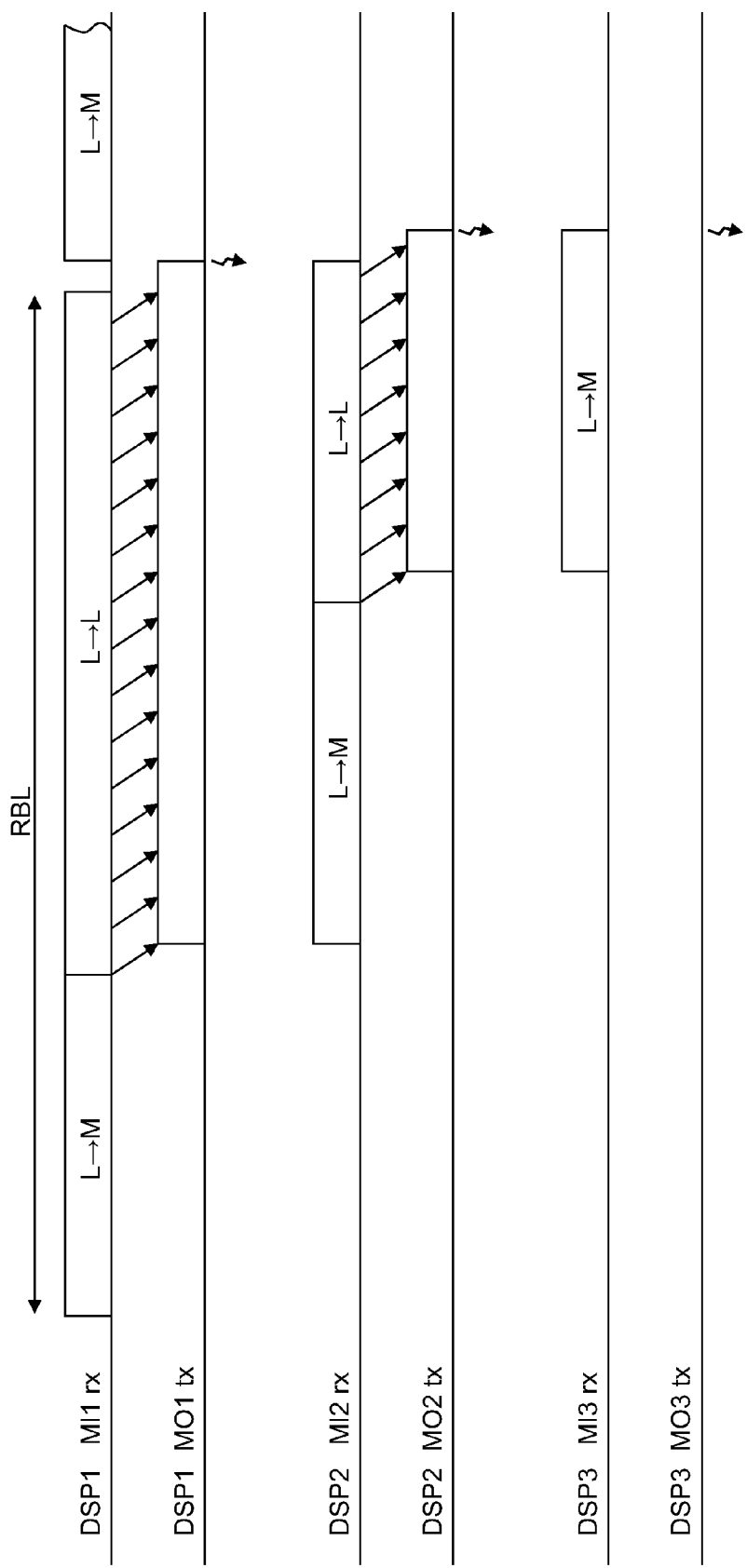
FIG. 5 shows a data stream flow plan illustrating how an incoming data stream of measurement values is subdivided within the processing unit and forwarded from one digital signal processor to the next.

FIG. 5 therefore shows a data stream flow plan of the measurement value inputs and outputs MI1, MO1, MI2, MO2, MI3 and MO3 of the three digital signal processors DSP1, DSP2, DSP3, which reveals the way in which the measurement values are distributed efficiently between the digital signal processors DSP1, DSP2, DSP3.

Essentially, the processing of the measurement values in each of the digital signal processors DSP1, DSP2, DSP3 includes three steps: first, the incoming measurement value is received and stored in a memory (usually internal) OCM1, OCM2, OCM3 assigned to the respective digital signal processor; in a subsequent step a computation algorithm, for example a regulation process, is applied by an arithmetic logic unit (ALU) to the measurement value stored in this way and calculates a result, here the regulator output variable $y_r$; as the third and final step, this result is read out again from the memory OCM1, OCM2, OCM3 and output at the result output ROM1, ROM2 or ROM3, respectively.

For the data input and output of the first and third steps, modern signal processors have so-called direct memory access (abbreviated to DMA) controllers which, via separate memory banks or when configured as "dual ported RAM", can perform the data input and output in parallel with the currently running algorithms of the digital signal processor without affecting the arithmetic logic unit.

To this end the DMA controllers of the TigerSHARC DSP, which are connected to the link ports, have three different operating modes for DMA transfer. In the "link-to-memory" mode L→M, data are read in at a link port and stored in the internal memory of the digital signal processor without any additional processor load until a particular number of values or bytes have been read in. In this case, the number of values or bytes to be transferred for each DMA transfer is freely selectable. The output of data uses the "memory-to-link" mode M→L of the DMA controller, in which the data are output from the assigned memory on the link port. Beyond this basic functionality of a DMA controller, the DMA controllers of the TigerSHARC DSP furthermore have a "link-to-link" mode L→L by which data received at one link port can be forwarded directly to another link port of the digital signal processor without any additional memory involved or processor load. This allows simple forwarding of incoming data to a subsequent digital signal processor.

The TigerSHARC DSP also allows concatenation of DMA transfers (chained DMA transfers) so that as soon as one DMA transfer has been completed, the DMA controller is able to start the next DMA transfer directly as in a chain, without any additional processor load being used for this purpose.

The DMA controllers of the TigerSHARC DSP furthermore allow two-dimensional DMA transfers, for which a memory range is considered as a two-dimensional array with n rows and m columns and an individual DMA transfer can send or receive a rectangular section thereof.

As shown in FIG. 5, the serial data stream of measurement values, which is received at the input 52 of the processing unit 48, is applied to the measurement value input MI1 of the first digital signal processor DSP1. The DMA controller of the first digital signal processor DSP1 is in this case programmed so that it initially reads a fraction of the measurement values, which is intended for processing in the first digital signal processor DSP1, into the memory OCM1 assigned to this digital signal processor DSP1 in the "link-to-memory" mode L→M.

Next, via the concatenation of DMA transfers, immediately thereafter the subsequent measurement values of the serial data stream are forwarded from the measurement value input MI1 to the measurement value output MO1 of the digital signal processor DSP1 in the "link-to-link" mode L→L. The delay resulting from this in the TigerSHARC DSPs being used, which is represented in FIG. 5 by the oblique arrows, is minimal and negligible in comparison with other time lags of the system as a whole.

Since the measurement value output MO1 of the first digital signal processor DSP1 is connected to the measurement value input MI2 of the second digital signal processor DSP2, the measurement values forwarded by the first digital signal processor DSP1 are applied to this measurement value input MI2. The second digital signal processor DSP2 in turn receives only a fraction of the measurement values in the "link-to-memory" mode L→M and transfers them into the memory OCM2 assigned to the digital signal processor DSP2. A remaining fraction is transferred in the "link-to-link" mode L→L to the measurement value output MO2 of the second digital signal processor DSP2.

This remaining fraction of the measurement values is finally received at the measurement value input MI3 of the third digital signal processor DSP3, and transferred in the "link-to-memory" mode L→M from its DMA controller into the assigned memory OCM3.

Each DMA controller of the digital signal processors DSP1, DSP2, DSP3 triggers an interrupt after receiving the last measurement value at the end of a DMA transfer chain, which is symbolised as a zigzag arrow in FIG. 5 and forms the clock of the respective digital signal processor. Owing to the virtually delay-free forwarding of the data in the "link-to-link" transfers, synchronisation of all the digital signal processors DSP1, DSP2, DSP3 in the processing chain is achieved since the interrupt is triggered almost simultaneously on all three digital signal processors DSP1, DSP2, DSP3. A data-driven system is thus obtained, which generates its system clock from the continuous data stream of the incoming measurement values.

As may be seen on the right-hand edge of the signal flow plan for the first digital signal processor DSP1, the triggering of the interrupt initiates not only the arithmetic logic unit starting to process the measurement values just received, but also a further DMA transfer chain which reads in the subsequent measurement values according to the same scheme for the next processing step.

VII

Processing Unit—Outgoing Data Stream

For output of the regulator variables $y_r$ to the power electronics 46, this principle of the DMA transfer chains is reversed.

Figure 6:
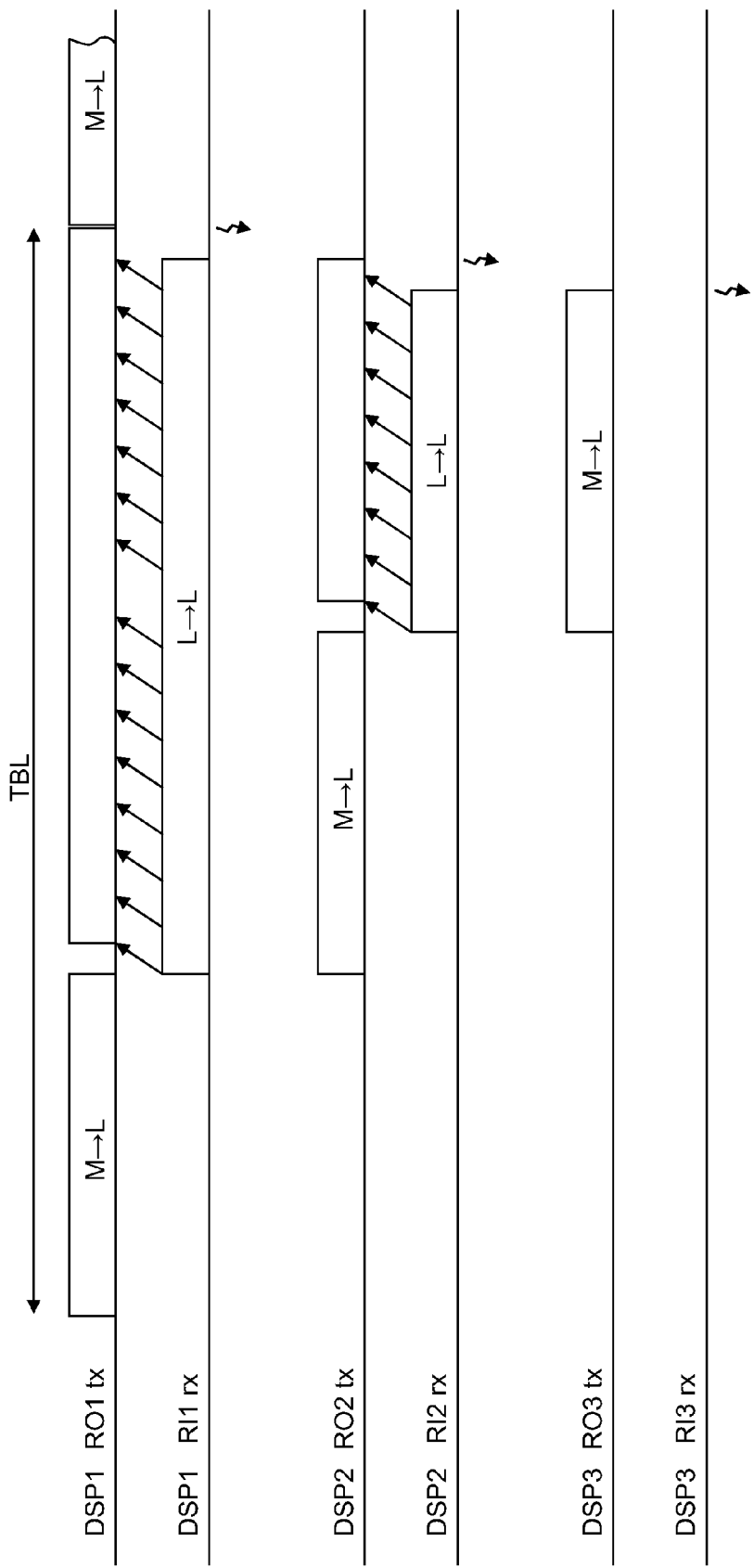
FIG. 6 shows a data stream flow plan illustrating how the output data streams of the individual digital signal processors are combined within the processing unit to form an outgoing data stream of regulator output variables, and are output.

As shown in FIG. 6, to this end a "memory-to-link" transfer M→L is initially carried out at the result output RO1 of the first digital signal processor DSP1 and outputs the results of the processing by the digital signal processor DSP1 at the output 50 of the processing unit 48. Immediately after this, the DMA controller of the first digital signal processor DSP1 switches into the "link-to-link" mode L→L between the result input RI1 and the result output RO1. During this, there is in turn a short time delay which is indicated by the oblique arrows in FIG. 6.

At the measurement result input RI1, the first digital signal processor DSP1 receives measurement values from the second digital signal processor DSP2, which the latter outputs at its result output RO2 via a "memory-to-link" transfer M→L. As soon as the second digital signal processor DSP2 has output its fraction of the results, it also switches into the "link-to-link" mode L→L and transfers the measurement values received from the third and last digital signal processor DSP3, which the latter outputs at its result output RO3. The measurement values of the third digital signal processor DSP3 are thus forwarded by the two "link-to-link" transfers L→L of the first and second digital signal processors DSP1 and DSP2 to the output 50 of the processing unit 48.

Each digital signal processor DSP1, DSP2, DSP3 thus outputs its own results and the results of the digital signal processors DSP2, DSP3 lying after it in the processing chain. Here again, an interrupt may be triggered at the end of the DMA transfer chains. Usually, however, it is sufficient to trigger interrupts for the reception DMA transfer chains since it can be assumed that the output data will be transmitted correctly. Thus, an interrupt routine which is responsible for reception of the measurement values may check whether the DMA transfer chains for transmission have been ended correctly, and then successively trigger the next two DMA transfer chains for reception and transmission.

VIII

Processing Unit—Latency Times

In terms of the control loop, particularly for reasons of stability, the shortest possible latency times are desirable between the instant when a measurement value is determined and the instant at which a regulator output variable $y_r$ resulting therefrom is transferred to the actuators 42 or, more precisely, the manipulated variable y has been established by the controlling element 70. The way in which specific configurations of the data input and the data output affect the latency times will therefore be explained below.

The interrupts triggered by the reception DMA transfer chains form a system clock of the processing unit 48. After the measurement values have been read into the assigned memories OCM1, OCM2, OCM3, the digital signal processors DSP1, DSP2, DSP3 first wait until the next interrupt in order to start the algorithm to be applied to the measurement values. The associated regulator output variable $y_r$ is in turn output one system cycle later.

Based on this, the best possible latency times would be achieved if each digital signal processor DSP1, DSP2, DSP3 has read in only a single measurement value or only one measurement value group associated with a micromirror 24, so that when using three digital signal processors DSP1, DSP2, DSP3 the regulation algorithm is already started after having read in the measurement values of three micromirrors 24. After transfer of the measurement values of three further micromirrors 24, in parallel with the processing of the measurement values, the regulator output variable $y_r$ for the first micromirror 24 would therefore already be output.

Yet since each interrupt, for example in order to resume the DMA transfer chains or owing to so-called "context switching", entails an interrupt overhead which takes up a particular proportion of the computation time available in the arithmetic logic units of the digital signal processors DSP1, DSP2, DSP3, such a procedure is not expedient for reasons of the performance of current digital signal processors DSP1, DSP2, DSP3. The incoming data stream of the measurement values is therefore subdivided into larger segments, or bursts. In this case, the measurement values of a plurality of micromirrors 24 are combined into a burst.

Although processing in bursts increases the latency time of the system, since the processing in the arithmetic logic unit does not begin until after the measurement values of a plurality of micromirrors 24 have been read in, the interrupt overhead not available for the actual control and regulation algorithm is however reduced since fewer interrupts are triggered.

With 4096 micromirrors 24 and a repetition frequency of 1 kHz, for example, the measurement values of a micromirror 24 will occur every 0.244 µs. If a reception burst length RBL of 1024 micromirrors 24 is selected, so that four reception bursts are used in order to process the measurement values of all 4096 micromirrors 24, then this leads to a temporal burst length of 250 µs. The arithmetic logic unit consequently begins to process the measurement values 250 µs after the measurement values of the first micromirror 24 arrive. The corresponding regulator output variable $y_r$ is output after a further 250 µs of calculation time, which gives a latency time of 500 µs plus X for the first micromirror 24. The unknown X is in this case the sum of a delay between the actual measurement and the reception at the processing unit 48, and a delay which results from the output of the regulator output variable $y_r$ and the delay in the controlling element 70.

An interrupt occurring every 250 µs leads to a minimal interrupt overhead of less than 1% of the computation capacity in a TigerSHARC DSP at 500 MHz. Therefore 99% of the computation capacity of the digital signal processors DSP1, DSP2, DSP3 is available for the control and regulation algorithm. If the control and regulation algorithm involves less computation capacity, then the reception burst length RBL may be reduced and correspondingly shorter latency times will be obtained with an increased interrupt overhead.

A compromise is therefore found between the latency time, the burst length RBL, the number of digital signal processors DSP1, DSP2, DSP3 and the complexity of the control and regulation algorithm used.

In the example above, it was assumed that the transfers of the incoming data stream and the outgoing data stream take place with the same data rate, and the order of the incoming measurement values relating to the micromirrors 24 corresponds to the outgoing order of the regulator output variables $y_r$, which are transferred to the power electronics 46 and finally to the corresponding actuators 42 of the micromirrors 24. The latency time is therefore equally long for each individual micromirror 24.

In practice, owing to relatively small jitters in the system, the data rate for transmission of the regulator output variables $y_r$ will be selected to be minimally higher than for reception of the measurement values, so that for example the time for the transfer of an output burst involves 99% of the time of an input burst. Buffers in the power electronics 46 then ensure that the increased data rate is accommodated and therefore the jitters of the system can be mitigated.

Since these jitters usually involve only a few measurement values in the serial data stream, the effect on the overall system remains minimal. If for example maximum jitters of 8 micromirrors 24 occur upon reception, then with 4096 micromirrors 24 this amounts to one $512^{th}$ of the measurement data rate. With a measurement data rate of 1 kHz, this is thus about 2 µs per micromirror 24, which is insignificant in comparison with the latency time of 500 µs plus X for a reception burst length RBL of 1024 micromirrors 24.

IX

Processing Unit—Multiple Data Rate of the Outgoing Data Stream

The methods just described assume that the data rate of the incoming data stream of the measurement values is at least substantially equal to the data rate of the outgoing data stream of the regulator output variables $y_r$. For many regulation algorithms, which use for example an observer or an estimator, or with combined control and regulation algorithms, however, it may be expedient for the output of the outgoing data stream to take place with a much higher (usually integer multiple) data rate than the reception of the incoming data stream, so that new manipulated variables y are applied several times to the micromirrors 24 between two measurements by the measuring device 54. This may, for example, be achieved by generating regulator output variables $y_r$ over a plurality of system cycles for each cohesive measurement value group which is assigned to a micromirror 24.

A higher data rate of the outgoing data stream allows, for example, interpolation of the manipulated variable y via pulse-width modulation, if the digital resolution of the controlling element 70 is intended to be increased. Furthermore, the higher data rate of the outgoing data stream can contribute to smoothing the signal profiles which occur.

Figure 7:
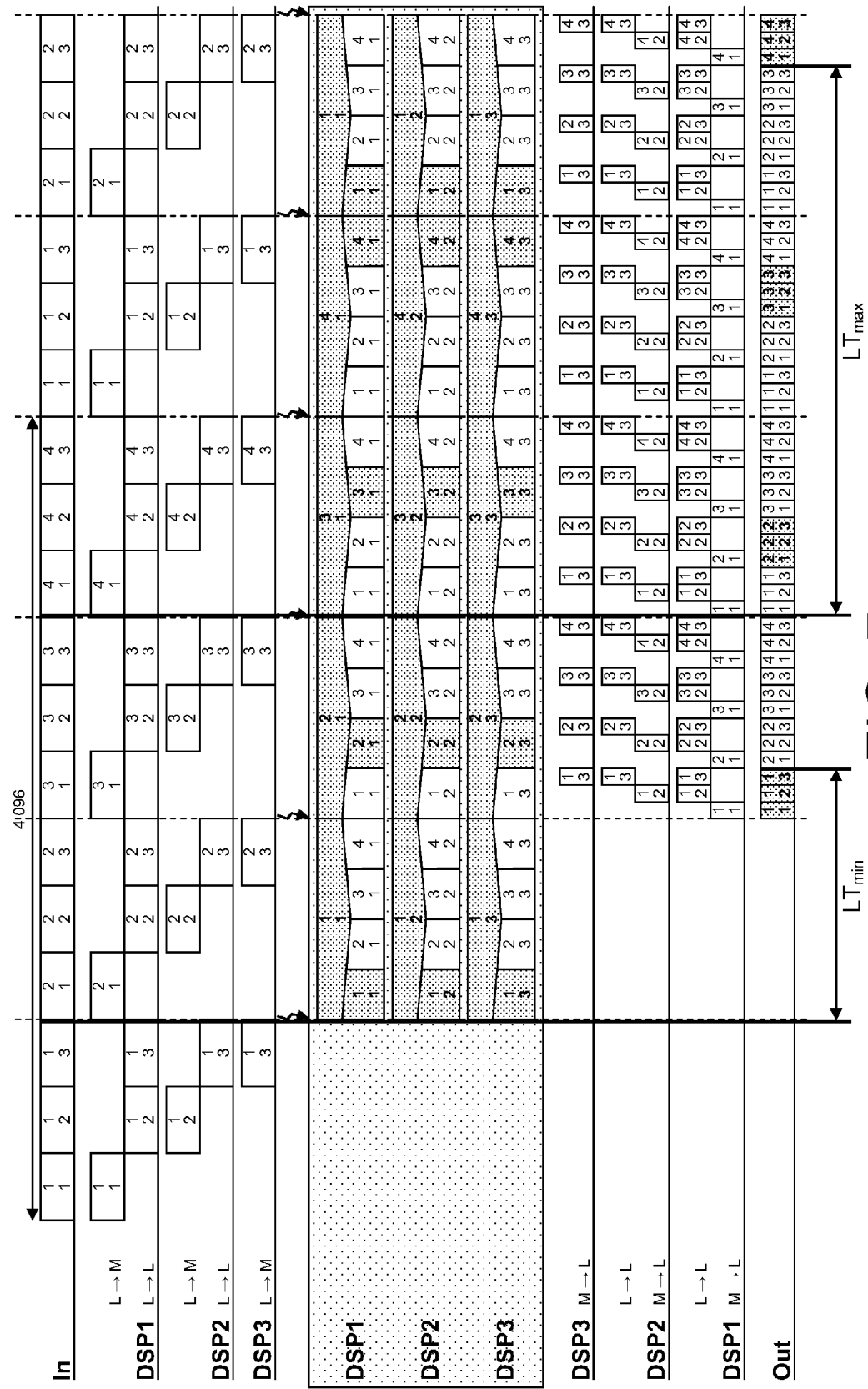
FIG. 7 shows a combined data stream flow plan and data stream processing plan of the processing unit, which shows a clock cycle scheme according to which the incoming data stream is processed to form an outgoing data stream.

Such an exemplary embodiment is shown in FIG. 7 in a combined data stream flow plan and data stream processing plan of the processing unit 48.

The upper part of FIG. 7 represents the reception of the measurement values in analogy with FIG. 5. An incoming data stream IN of measurement values is shown in the first row as a continuous series of numbered data packets. Based on an exemplary embodiment with 4096 micromirrors 24, the allocation of the data packets to the micromirrors 24 is repeated, as indicated by the double arrow, after the measurement values of all 4096 micromirrors 24 have been received. With a measurement frequency of 1 kHz, this corresponds to a period of 1 ms between two measurements of the same micromirror 24.

As in the example above, a reception burst length RBL of 1024 micromirrors 24 is assumed, which are read into the processing unit 48 within a system cycle of 250 μs. The measurement values of all 4096 micromirrors 24 are therefore received in four successive reception bursts. For orientation, in FIG. 7 the upper number of the numbered data packets indicates whether they belong to the first, second, third or fourth reception burst of measurement values.

As already explained in FIG. 5, a first fraction of the first reception burst is initially received by the first digital signal processor DSP1 and transferred into its memory OCM1. In order to distribute the computational load approximately equally between the three digital signal processors DSP1, DSP2, DSP3, this first fraction corresponds to the measurement value groups of 1024÷3≈341 micromirrors 24. The remaining two thirds of the measurement values of the first burst are then forwarded to the second digital signal processor DSP2. This in turn likewise copies the measurement value groups of 341 micromirrors 24 into its memory OCM2 and transfers the measurement value groups of the last 342 micromirrors 24 to the third digital signal processor DSP3 for processing.

In FIG. 7, the three resulting data packets of 341 or 342 micromirrors 24 are labelled with the lower number which indicates which of the digital signal processors DSP1, DSP2, DSP3 the respective data packet is processed on. For example, the data packet with the numbers 1 over 3 corresponds to the fraction of the measurement values of the first burst which is processed on the third digital signal processor DSP3.

The almost simultaneous interrupts following the DMA transfer chains, which are indicated here by a single zigzag arrow, start the calculations by the individual digital signal processors DSP1, DSP2, DSP3.

The execution of the control and regulation algorithms is symbolically represented in the middle region with a grey background in FIG. 7. Each row symbolises the processing of the measurement values in one of the digital signal processors DSP1, DSP2, DSP3.

As indicated by a grey processing arrow extending over the system cycle in the upper half of each processing row, the measurement values currently read in during the preceding system cycle enter directly into the calculation of the corresponding result values, likewise represented by grey. For example, the first digital signal processor DSP1 processes the measurement values of the data packet 1 over 1 which were read in during the preceding system cycle, so that the result data packet 1 over 1 based on these measurement values in the regulator output variable $y_r$, which is likewise represented with a grey background in the lower half of the processing row, is the processing result of current measurement values. The three other result data packets 2 over 1, 3 over 1 and 4 over 1, which are generated in this clock cycle by the first digital signal processor DSP1, are calculated with the aid of older measurement values already lying further in the past, or for example with the aid of values coming from an observer or estimator.

There is a corresponding procedure for the current result data packets 1 over 2 and 1 over 3, which are generated by the two digital signal processors DSP2 and DSP3.

In parallel with these calculations, the data packets of the second reception burst are read into the memories of the digital signal processors DSP1, DSP2 and DSP3. After the end of the calculations and the interrupt following the second reception burst, as shown in the lower third of FIG. 7, the regulator output variables $y_r$ are output in result data packets and transferred to the power electronics 46. As can be seen with the aid of the narrow result data packets represented, four times the data rate of the incoming data stream IN is used for this, so that twelve result data packets are output during a system cycle.

As already shown in FIG. 5, the first digital signal processor DSP1 emits the newly calculated regulator output variables $y_r$ for the first 341 micromirrors 24 at its result output RO1 by the DMA controller outputting the result data packet 1 over 1. The DMA controller of the first digital signal processor DSP1 then switches into the "link-to-link" mode, while the second digital signal processor DSP2 transfers the result data packet 1 over 2 so that it directly follows the result data packet 1 over 1 in the outgoing serial data stream OUT. Lastly, the second digital signal processor DSP2 also switches into the "link-to-link" mode and the third digital signal processor DSP3 outputs the result data packet 1 over 3 of the last 342 micromirrors 24 of the first reception burst at its result output RO3. The new regulator output variables $y_r$ of the 1024 respective micromirrors 24 have therefore been output in the same order as the micromirrors 24 were measured by the measuring device 54.

Since the transfer has been carried out with four times the data rate of the incoming data stream, a further ¾ of a system cycle is now available in order to output the regulator output variables $y_r$, based on older measurements, for the other 3072 micromirrors 24. This is done according to the same scheme, so that the reception data packets 2 over 1, 2 over 2 and 2 over 3 belonging to the second reception burst are initially transferred. The result data packets assigned to the third and fourth reception bursts then follow in the same order.

During this third system cycle represented, in which the results of the first system cycle have been output, the third reception burst is simultaneously read in and a calculation is carried out with the aid of the second reception burst's measurement values read in during the second cycle, which are assigned to the micromirrors 24 numbers 1025 to 2048.

In the fourth system cycle represented, the result data packets 1 over 1, 1 over 2 and 1 over 3, the obtained regulator output variables $y_r$ of which are based on the measurement results already lying three system cycles behind, are initially transferred according to the same scheme as before in the first quarter of the system cycle. Following this, the result data packets 2 over 1, 2 over 2 and 2 over 3 are transferred. Since the calculation of the regulator output variables $y_r$ in the preceding system cycle was based on current measurement values of the second reception burst, in the fourth system cycle the result data packets 2 over 1, 2 over 2 and 2 over 3 have a grey background in order to indicate that they relate to the most current measurement values. The result data packets for the micromirrors 24 numbers 2049 to 3072 and numbers 3073 to 4096 finally follow, which are in turn based on measurement values already lying further in the past.

In the fifth system cycle represented, in which the results calculated during the fourth system cycle are output, the regulator output variables $y_r$ of the result data packets 3 over 1, 3 over 2 and 3 over 3 are the ones which are based on current measurement values. These result data packets are output after half of the system cycle, since six other result data packets have already preceded these result data packets within the system cycle.

Correspondingly, in the sixth system cycle represented in FIG. 7, the result data packets 4 over 1, 4 over 2 and 4 over 3 have a grey background in order to indicate that they are based on current measurement values of the fourth reception burst, which are read in during the fourth system cycle. Within the system cycle, their output begins after ¾ of the time of the system cycle.

Since the order of the regulator output variables $y_r$ transferred to the power electronics 46 in the outgoing data stream OUT is always the same, there are different latency times for different micromirrors 24 from reception of the associated measurement values until the first output of a regulator output variable $y_r$ based on these measurement values.

The minimum latency time $LT_{min}$ is found for the last micromirror 24 of the reception data packet 1 over 3, i.e. micromirror 24 number 1024, the associated regulator output variable $y_r$ of which is output at the end of the result data packet 1 over 3 in the outgoing data stream OUT. The minimum latency time $LT_{min}$ is about 1¼ system cycles, i.e. about 312.5 μs.

For the result data packets 4 over 1, 4 over 2 and 4 over 3 of the fourth reception burst, which are arranged at the end of a system cycle in the outgoing data stream OUT, the maximum latency time $LT_{max}$ is found between the reception of the measurement values of the first micromirror 24 of the reception data packet 4 over 1, i.e. micromirror 24 number 3073, and the first regulator output variable $y_r$ of the transmission data packet 4 over 1. The maximum latency time $LT_{max}$ therefore includes 2¾ system cycles, i.e. about 687.5 μs.

Averaged over all the micromirrors 24, however, there is as before the above-explained latency time of 500 μs over two system cycles.

X

Processing Unit—Interleaving of the Data in the Outgoing Data Stream

For the stability of the control loop, however, it is crucial that the maximum latency time $LT_{max}$ should be kept as short as possible. A processing unit 48 in which the same latency time of, for example, 500 μs occurs for all micromirrors 24 would therefore be preferable.

Figure 8:
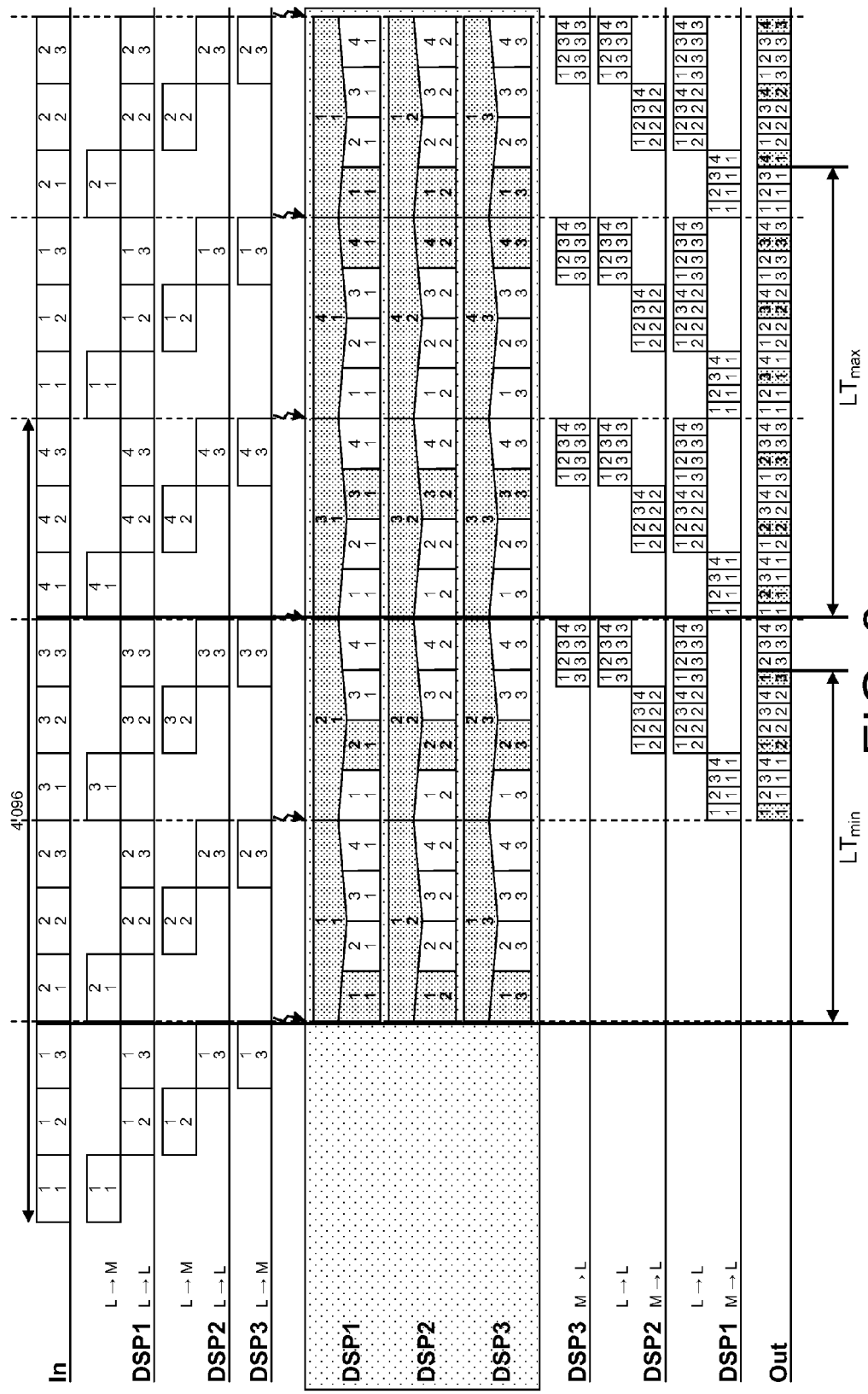
FIG. 8 shows a combined data stream flow plan and data stream processing plan of the processing unit according to a different exemplary embodiment, with a reduced maximum latency time between the input of a measurement value and the output of an associated regulator output variable of a mirror.

As shown with the aid of the exemplary embodiment in FIG. 8, this can be partially achieved by selecting a different order in respect of the individual micromirrors 24 for the regulator output variables $y_r$ in the outgoing data stream OUT than for the measurement values in the incoming data stream IN.

In principle, it is unimportant whether the order in the incoming data stream IN or in the outgoing data stream OUT is changed. Under certain circumstances, however, it is simpler to alter the order of the regulator output variables $y_r$ in the data stream OUT, since it is therefore possible for the evaluation algorithms of the measuring device 54 to be kept unchanged.

FIG. 8 shows a combined data stream flow plan and data stream processing plan of the processing unit 48, according to an exemplary embodiment in which merely the order in which the result data packets are output has been changed.

FIG. 8 therefore differs from FIG. 7 only in the lower third, in which the output of the calculated regulator output variables $y_r$ is shown.

In this exemplary embodiment, the first digital signal processor DSP1 initially outputs all the regulator output variables $y_r$ calculated by it in the preceding system cycle, which belong to the micromirrors 24 of the four reception bursts 1 over 1, 2 over 1, 3 over 1 and 4 over 1. In this first third of the system cycle, only the regulator output variables $y_r$ of the first result data packet 1 over 1 are based on current measurement values. As in the previous exemplary embodiment, on the other hand, the regulator output variables $y_r$ of the three result packets 2 over 1, 3 over 1 and 4 over 1 are based on measurement values already lying further in the past.

The forwarding of the results by the processing chain is carried out similarly as in the previous exemplary embodiment, so that the first digital signal processor DSP1 now switches into the "link-to-link" mode in order to forward the results of the subsequent digital signal processors DSP2 and DSP3 to the output 50 of the processing unit 48.

Next, the second digital signal processor DSP2 outputs all the regulator output variables $y_r$ calculated by it in the result data packets 1 over 2, 2 over 2, 3 over 2 and 4 over 2. Again, only the regulator output variables $y_r$ of the first result data packet 1 over 2 are based on current measurement values.

Lastly, i.e. after ⅔ of the system cycle, the third digital signal processor DSP3 transmits all the regulator output variables $y_r$ calculated by it in the result data packets 1 over 3, 2 over 3, 3 over 3 and 4 over 3, again only the result packet 1 over 3 being based on current measurement values.

As indicated by shading, within the third system cycle represented, the regulator output variables $y_r$ of the result data packets 1 over 1, 1 over 2 and 1 over 3 are thus based on current measurement values which were read in two system cycles previously. Owing to the order selected, the latency times of the three result packets approximately correspond to one another, and the minimum latency time $LT_{min}$ is found for the regulator output variable $y_r$ of the last micromirror 24 in the result data packet 1 over 3 as approximately ⅞ of the system cycle, i.e. about 437.5 μs.

In the fourth system cycle represented, on the other hand, the regulator output variables $y_r$ of the result data packets 2 over 1, 2 over 2 and 2 over 3 are based on current measurement values. Since these result data packets are respectively output after the result data packets 1 over 1, 1 over 2 and 1 over 3, the associated regulator output variables $y_r$ have latency times which are about 1/12 of a system cycle longer. The maximum latency time $LT_{max}$ is therefore obtained for the regulator output variables $y_r$ output in the sixth system cycle represented, of the last result data packets 4 over 1, 4 over 2 and 4 over 3. The maximum latency time $LT_{max}$ is about 9/4 system cycles, i.e. about 562.5 μs.

The maximum latency time $LT_{max}$ and the minimum latency time $LT_{min}$ therefore now differ only by about ¼ of a system cycle from the average latency time of 500 μs.

Such a procedure, in which the result data packets based on current measurement values are interleaved with a smaller number of current result data packets, is also referred to as "interleaving of data".

Figure 9:
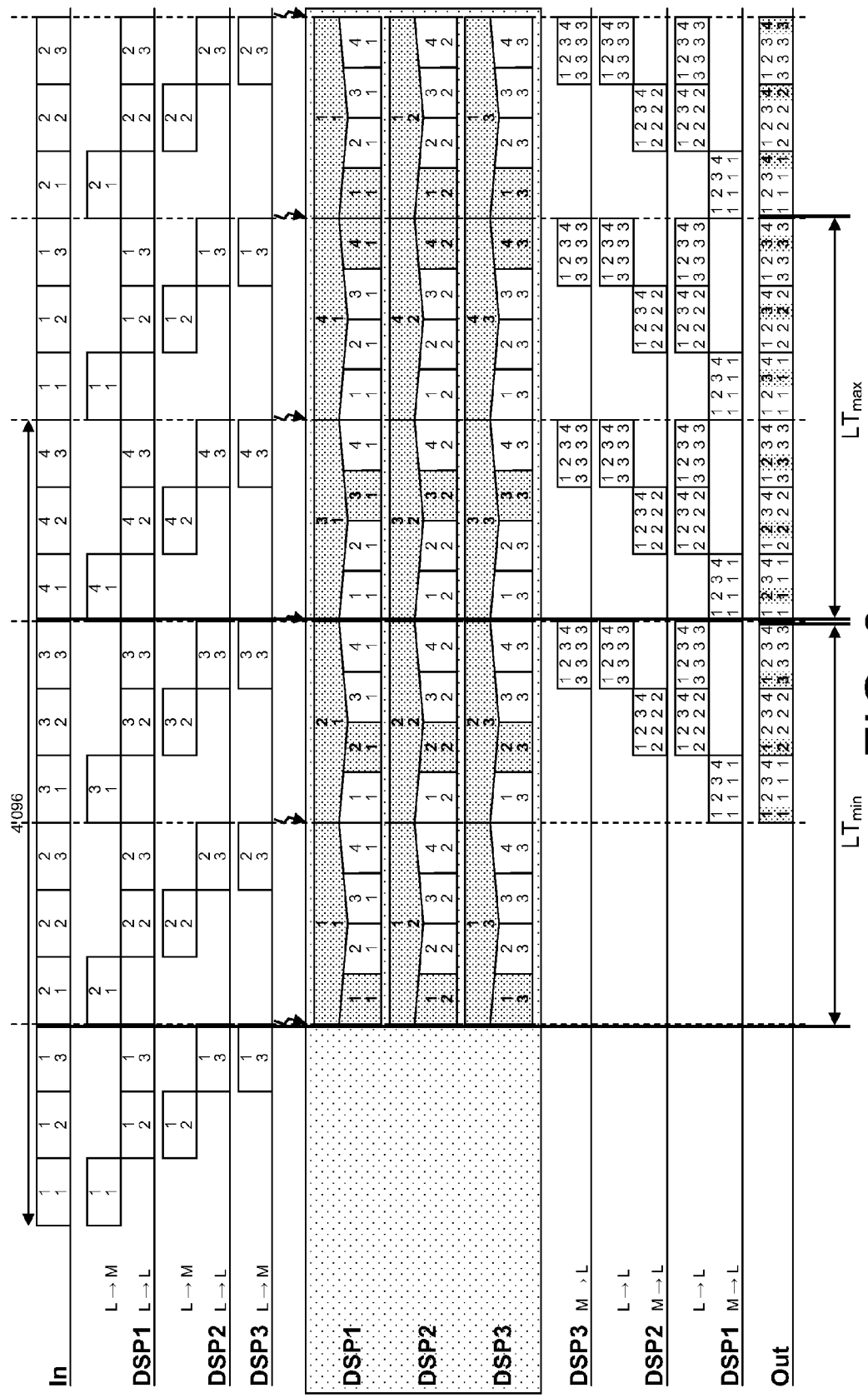
FIG. 9 shows a combined data stream flow plan and data stream processing plan of the processing unit according to another exemplary embodiment, with a further reduced maximum latency time between the input of a measurement value and the output of an associated regulator output variable of a mirror.

As shown by the exemplary embodiment represented in FIG. 9, the concept of interleaving can be refined further in order to obtain an approximately equal latency time for all the micromirrors 24. To this end, the interleaving is also applied to the individual micromirrors 24 of the result data packets.

As indicated in FIG. 9 by omitting the vertical subdivision of the result data packets, for example in the output of the first digital signal processor DSP1 the order of the regulator output variables $y_r$ is rearranged so that the associated regulator output variables $y_r$ are received first by the first micromirror 24 of the result data packet 1 over 1, next by the first micromirror 24 of the result data packet 2 over 1, then by the first micromirror 24 of the result data packet 3 over 1, and finally by the first micromirror 24 of the result data packet 4 over 1. This is followed by the second micromirrors 24 of each result data packet 1 over 1, 2 over 1, 3 over 1 and 4 over 1. Next, the regulator output variables $y_r$ of the third micromirrors 24, and so on until all the regulator output variables $y_r$ calculated by the first digital signal processor DSP1 have been output. There is a corresponding procedure for the other two digital signal processors DSP2 and DSP3.

Such interleaving between the individual result data packets of a digital signal processor DSP1, DSP2, DSP3 is particularly easy to implement with the two-dimensional DMA transfers of the TigerSHARC DSPs being used. With the aid of the two-dimensional DMA transfers, and with a suitable selection of the DMA parameters, the regulator output variables $y_r$ lying successively in the memory are correspondingly interleaved with one another during the transfer. Since the TigerSHARC DSPs are restricted to a minimum element size of 128 bits for two-dimensional DMA transfers, however, and three regulator output variables $y_r$ i.e. 48 bits are respectively for a micromirror 24, the regulator output variables $y_r$ of at least 8 micromirrors 24 of a result data packet is output together. In practice, however, this leads only to minimal differences from the average latency time of 500 µs.

The orders explained in the outgoing data stream OUT and the latency times may be adapted in relation to the number of different reception bursts, the data rates in the incoming data stream IN and in the outgoing data stream OUT, and the number of digital signal processors DSP1, DSP2 and DSP3.

XI

Processing Unit—Expansion Circuit Boards

Figure 10:
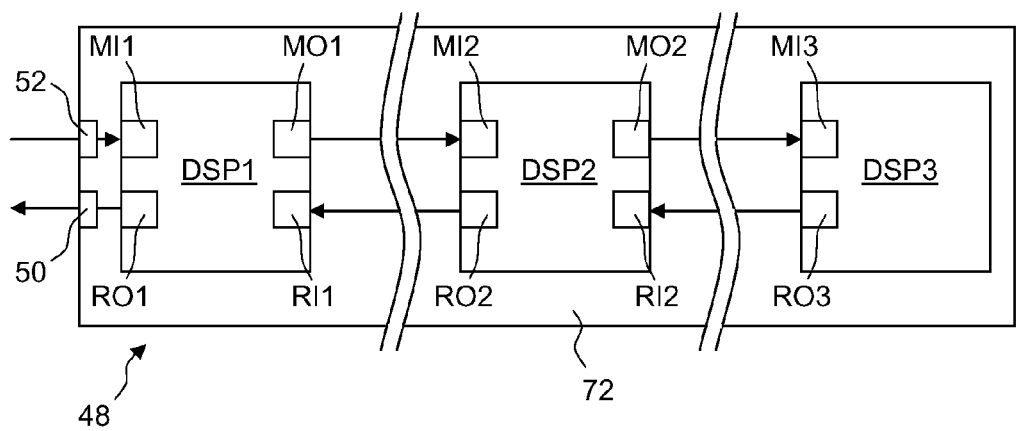
FIG. 10 shows a schematic representation of the processing unit illustrating how two or more digital signal processors can be concatenated.

As already indicated, the processing unit 48 may have a different number of digital signal processors DSP1, DSP2 and DSP3, according to the computational load. FIG. 10 therefore shows a processing unit 48 in which, besides the two digital signal processors DSP1 and DSP3 at the ends of the processing chain, a further digital signal processor DSP2 is arranged on a separately available expansion circuit board 72. To this end, the expansion circuit board 72 includes a connecting plug and a connecting jack, so that one expansion circuit board 72 can be plugged into the next and a processing chain with any desired length can thus be produced. Although the processing unit 48 is already operable with two digital signal processors DSP1 and DSP3, it can thus be expanded with any desired number of digital signal processors DSP2, so that demanding calculations with a high computational load can be carried out.

XII

Processing Unit—Alternative Interconnection of the Result Inputs and Outputs

Figure 11:
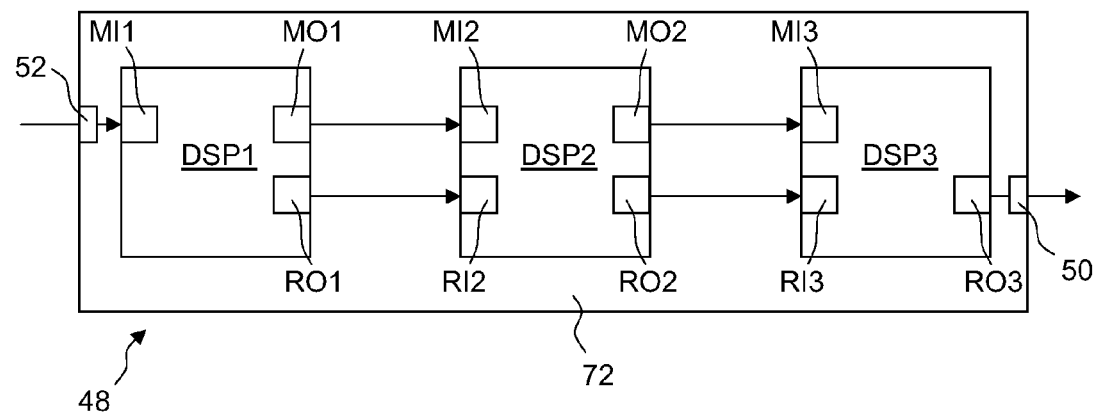
FIG. 11 shows a schematic representation of the processing unit according to an exemplary embodiment with an alternative path for the outgoing data stream.

FIG. 11 shows a processing unit 48 in which the results of the processing are passed through the processing chain in the same direction as the measurement values to be processed. Unlike in the previous exemplary embodiments, to this end the result output RO1 of the first digital signal processor DSP1 is connected to the result input R12 of the second digital signal processor DSP2. The result output RO2 of the latter is in turn connected to a result input R13 of the third digital signal processor DSP3. Lastly, the result output RO3 of the third digital signal processor DSP3 is connected to the output 50 of the processing unit 48.

With correspondingly adapted programming of the DMA transfers of the individual digital signal processors DSP1, DSP2, DSP3, instead of in the opposite direction to the measurement values, the results are then forwarded in the same direction through the processing chain. The forwarding delays for the results of the respective digital signal processors DSP1, DSP2, DSP3 are therefore approximately equal, which may be advantageous particularly for long chains.

What is claimed is:

1. An apparatus, comprising:
    a measuring device configured to generate a sequence of measurement values; and
    a processing unit comprising a processing chain configured to process the measurement values, the processing chain comprising a plurality of digital signal processors including a first digital signal processor in the processing chain and a last digital signal processor in the processing chain,
    wherein:
        the first digital signal processor in the processing chain is in communication with the measuring device to receive the sequence of measurement values;
        each subsequent digital signal processor in the processing chain is in communication with a respective preceding digital signal processor in the processing chain;
        the digital signal processors are programmed so that each digital signal processor processes only a fraction of the measurement values and generates processing results therefrom;
        with the exception of the last digital signal processor in the processing chain, each digital signal processor is programmed to forward a remaining fraction of the measurement values to its respective next digital signal processor in the processing chain; and
        the apparatus is a microlithographic projection exposure apparatus.

2. The apparatus of claim 1, further comprising an optical component and an actuating device, wherein the actuating device comprises a plurality of actuators configured to act on the optical component, the processing results of the processing unit are deliverable to the actuating device, and the actuating device is configured to modify a property of the optical component based on the processing results.

3. The apparatus of claim 2, wherein the optical component comprises a plurality of mirrors which are adjustable via the actuators actuating device.

4. The apparatus of claim 1, wherein:
    the processing unit comprises an input configured to receive the measurement values;
    the first digital signal processor in the processing chain comprises:
        a measurement data input in communication with the input of the processing unit; and
        a measurement data output configured to forward the remaining fraction of the measurement values to its next digital signal processor in the processing chain;

except for the first digital signal processor in the processing chain, each digital signal processor in the processing chain comprises a measurement data input in communication with a measurement data output of its respective preceding digital signal processor in the processing chain so that the digital signal processor receives the remaining fraction of the measurement values forwarded by its respective preceding digital signal processor in the processing chain.

5. The apparatus of claim 4, wherein:
each digital signal processor comprises a result output configured to output generated processing results;
the processing unit comprises an output configured to output all the processing results of the processing chain;
the output of the processing unit is in communication with the result output of the first digital signal processor in the processing chain;
with the exception of the last digital signal processor in the processing chain, each digital signal processor in the processing chain:
comprises a result input in communication with the result output of its respective next digital signal processor in the processing chain; and
is programmed so that, at its result output, it outputs its processing results which have been generated by the subsequent digital signal processors in the processing chain and which it receives at its result input; and
the last digital signal processor (DSP3) in the processing chain is programmed so that it outputs only its own processing results at its result output (RO3).

6. The apparatus of claim 4, wherein:
each digital signal processor comprises a result output configured to output generated processing results;
the processing unit comprises an output configured to output all the processing results of the processing chain;
the output of the processing unit is in communication with the result output of the last digital signal processor in the processing chain;
with the exception of the first digital signal processor in the processing chain, each digital signal processor:
comprises a result input connected to the result output of its respective preceding digital signal processor in the processing chain; and
is programmed so that, at its result output, it outputs its processing results as well as processing results generated by the preceding digital signal processors in the processing chain and which it receives at its result input; and
the first digital signal processor in the processing chain is programmed so that it outputs only its own processing results at its result output.

7. The apparatus of claim 4, wherein at least one further digital signal processor, which itself processes only a fraction of the received measurement values and forwards the remaining fraction, is connected between the first digital signal processor in the processing chain and the last digital signal processor in the processing chain.

8. The apparatus of claim 5, wherein:
at least one further digital signal processor, which itself processes only a fraction of the received measurement values and forwards the remaining fraction, is connected between the first digital signal processor in the processing chain and the last digital signal processor in the processing chain; and
the at least one further digital signal processor comprises:
a measurement data input configured to receive a fraction of the measurement values from a measurement data output of a preceding digital signal processor in the processing chain;
a measurement data output configured to transfer a fraction of the measurement values, not to be processed by the at least one further digital signal processor, to a measurement data input of a subsequent digital signal processor in the processing chain;
a result input configured to receive processing results from a subsequent digital signal processor in the processing chain; and
a result output configured to transfer processing results generated by the at least one further digital signal processor and the processing results which come from the subsequent digital signal processors in the processing chain to the result input of a preceding digital signal processor in the processing chain.

9. The apparatus of claim 6, wherein:
at least one further digital signal processor, which itself processes only a fraction of the received measurement values and forwards the remaining fraction, is connected between the first digital signal processor in the processing chain and the last digital signal processor in the processing chain; and
the at least one further digital signal processor comprises:
a measurement data input configured to receive a fraction of the measurement values from a measurement data output of a preceding digital signal processor in the processing chain;
a measurement data output configured to transfer a fraction of the measurement values, not to be processed by the at least one further digital signal processor, to a measurement data input of a subsequent digital signal processor in the processing chain;
a result input, which is adapted to receive processing results from a preceding digital signal processor in the processing chain; and
a result output which is adapted to transfer processing results generated by the at least one further digital signal processor and the processing results which come from the preceding digital signal processors in the processing chain to the result input of a subsequent digital signal processor in the processing chain.

10. The apparatus of claim 1, wherein each digital signal processor comprises two inputs and two outputs.

11. The apparatus of claim 1, wherein each digital signal processor is assigned a memory and a memory access unit.

12. The apparatus of claim 1, wherein:
the digital signal processors are configured to be used with cyclic operation; and
each digital signal processor is configured so that in each clock cycle measurement values are received, measurement values are processed to form processing results, and the processing results are output.

13. The apparatus of claim 1, wherein the digital signal processors of the processing unit are programmed so that the processing results and/or the measurement values are output and received while being interleaved.

14. An apparatus, comprising:
a measuring device configured to generate a sequence of measurement values; and
a processing unit comprising a processing chain configured to process the measurement values, the processing chain comprising a plurality of digital signal processors including a first digital signal processor in the processing chain and a last digital signal processor in the processing chain, wherein:
the first digital signal processor in the processing chain is in communication with the measuring device to receive the sequence of measurement values;
each subsequent digital signal processor in the processing chain is in communication with a respective preceding digital signal processor in the processing chain;
the digital signal processors are programmed so that each digital signal processor processes only a fraction of the measurement values and generates processing results therefrom;
with the exception of the last digital signal processor in the processing chain, each digital signal processor is programmed to forward a remaining fraction of the measurement values to its respective next digital signal processor in the processing chain;
the apparatus is a microlithographic projection exposure apparatus;
the sequence of measurement of values includes atomic measurement value groups which are processable independently of one another;
the first digital signal processor in the processing chain is programmed so that the sequence of measurement values is received while being subdivided into bursts; and
a burst includes a number of independent measurement value groups which is greater than the number of digital signal processors.

15. The apparatus of claim 14, wherein each digital signal processor is configured to generate processing results for each measurement value group over a plurality of clock cycles.

16. A method, comprising:
providing a processing unit comprising a plurality of digital signal processors which are interconnected to form a processing chain;
receiving a sequence of measurement values by the first digital signal processor in the processing chain, the measurement values being in a microlithographic projection exposure apparatus; and
processing the measurement values,
wherein each digital signal processor processes only a fraction of the measurement values and generates processing results therefrom and, with the exception of the last digital signal processor in the processing chain, forwards the remaining fraction of the measurement values to the respective next digital signal processor in the processing chain for processing.

17. The method of claim 16, wherein the processing results are used to modify a property of an optical component of the microlithographic projection exposure apparatus.

18. The method of claim 16, wherein the processing results are used to drive actuators of a multi-mirror array of the microlithographic projection exposure apparatus.

19. An expansion unit, comprising:
a digital signal processor comprising:
a measurement data input configured to receive a fraction of measurement values from a preceding digital signal processor in a processing chain;
a measurement data output configured to transfer a fraction of the measurement values, not to be processed by the digital signal processor, to a measurement data input of the next digital signal processor in the processing chain;
a result input configured to receive processing results from the next or preceding digital signal processor in the processing chain;
a result output configured to transfer processing results generated by this digital signal processor and the processing results which come from the subsequent or preceding digital signal processors in the processing chain respectively to the result input of the preceding or next digital signal processor in the processing chain; and
the expansion unit is configured to connect to a processing unit of a microlithographic projection exposure apparatus to increase a number of digital signal processors in the processing unit.

20. An illumination system, comprising:
a measuring device configured to generate a sequence of measurement values;
a processing unit comprising a processing chain configured to process the measurement values, the processing chain comprising a plurality of digital signal processors including a first digital signal processor in the processing chain and a last digital signal processor in the processing chain,
wherein:
the first digital signal processor in the processing chain is in communication with the measuring device to receive the sequence of measurement values;
each subsequent digital signal processor in the processing chain is in communication with a respective preceding digital signal processor in the processing chain;
the digital signal processors are programmed so that each digital signal processor processes only a fraction of the measurement values and generates processing results therefrom;
with the exception of the last digital signal processor in the processing chain, each digital signal processor is programmed to forward a remaining fraction of the measurement values to its respective next digital signal processor in the processing chain; and
the illumination system is a microlithographic illumination system.

* * * * *

UNITED STATES PATENT AND TRADEMARK OFFICE
CERTIFICATE OF CORRECTION

PATENT NO.        : 9,767,068 B2
APPLICATION NO.   : 13/747118
DATED             : September 19, 2017
INVENTOR(S)       : Christian Kempter Page 1 of 1

It is certified that error appears in the above-identified patent and that said Letters Patent is hereby corrected as shown below:

On the Title Page

Column 2, Line 1 under "OTHER PUBLICATIONS", delete "correspnding" and insert
-- corresponding --.

Signed and Sealed this
Twenty-eighth Day of November, 2017

Joseph Matal
*Performing the Functions and Duties of the*
*Under Secretary of Commerce for Intellectual Property and*
*Director of the United States Patent and Trademark Office*